(12) United States Patent
Nowatari et al.

(10) Patent No.: US 8,389,979 B2
(45) Date of Patent: Mar. 5, 2013

(54) LIGHT-EMITTING ELEMENT, LIGHT-EMITTING DEVICE, ELECTRONIC DEVICE, AND LIGHTING DEVICE

(75) Inventors: Hiromi Nowatari, Atsugi (JP); Satoshi Seo, Kawasaki (JP); Nobuharu Ohsawa, Zama (JP); Tetsuo Tsutsui, Kasuga (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 416 days.

(21) Appl. No.: 12/785,644

(22) Filed: May 24, 2010

(65) Prior Publication Data

US 2010/0301316 A1     Dec. 2, 2010

(30) Foreign Application Priority Data

May 29, 2009 (JP) .................... 2009-131017

(51) Int. Cl.
*H01L 51/52* (2006.01)
*H01L 51/54* (2006.01)

(52) U.S. Cl. ............ 257/40; 257/79; 257/E51.018; 257/E51.028

(58) Field of Classification Search ............ 257/40, 257/72, 79, 98, E51.018, E51.026, E51.028, 257/E51.061
See application file for complete search history.

(56) References Cited

U.S. PATENT DOCUMENTS

| | | | |
|---|---|---|---|
| 6,013,384 A | 1/2000 | Kido et al. | |
| 7,053,412 B2 | 5/2006 | Hack et al. | |
| 7,192,659 B2 | 3/2007 | Ricks et al. | |
| 7,462,883 B2 | 12/2008 | Kumaki et al. | |
| 7,560,862 B2 | 7/2009 | Liao et al. | |
| 7,732,808 B2 | 6/2010 | Ikeda et al. | |
| 7,737,626 B2 | 6/2010 | Kumaki et al. | |
| 7,893,427 B2 | 2/2011 | Kumaki et al. | |
| 7,956,349 B2 | 6/2011 | Tsutsui et al. | |
| 7,964,864 B2 | 6/2011 | Kumaki et al. | |
| 7,985,974 B2 | 7/2011 | Nowatari et al. | |
| 8,040,047 B2 | 10/2011 | Ushikubo et al. | |

(Continued)

FOREIGN PATENT DOCUMENTS

| | | |
|---|---|---|
| JP | 10-270171 | 10/1998 |
| JP | 2005-209643 | 8/2005 |

(Continued)

OTHER PUBLICATIONS

Liao et al., "High-efficiency tandem organic light-emitting diodes," Appl. Phys. Lett. (Applied Physics Letters), vol. 84, No. 2, pp. 167-169, Jan. 12, 2004.

(Continued)

*Primary Examiner* — Teresa M Arroyo
*Assistant Examiner* — Whitney T Moore
(74) *Attorney, Agent, or Firm* — Eric J. Robinson; Robinson Intellectual Property Law Office, P.C.

(57) ABSTRACT

An object is to provide a light-emitting element in which suppression of a drive voltage increase is achieved. Another object is to provide a light-emitting device that has reduced power consumption by including such a light-emitting element. In a light-emitting element having an EL layer between an anode and a cathode, between the cathode and the EL layer, a first layer capable of carrier generation is formed in contact with the cathode, a second layer which accepts and transports the electrons generated in the first layer is formed in contact with the first layer, and a third layer which injects the electrons accepted from the second layer into the EL layer is formed in contact with the second layer.

69 Claims, 12 Drawing Sheets

U.S. PATENT DOCUMENTS

| | | | |
|---|---|---|---|
| 8,158,991 | B2 | 4/2012 | Nowatari et al. |
| 8,247,086 | B2 | 8/2012 | Inoue et al. |
| 2003/0127967 | A1 | 7/2003 | Tsutsui et al. |
| 2003/0189401 | A1 | 10/2003 | Kido et al. |
| 2005/0098207 | A1 | 5/2005 | Matsumoto et al. |
| 2005/0104511 | A1 | 5/2005 | Liao et al. |
| 2006/0008740 | A1 | 1/2006 | Kido et al. |
| 2006/0220534 | A1 | 10/2006 | Shibanuma et al. |
| 2006/0292394 | A1* | 12/2006 | Iwaki et al. .................. 428/690 |
| 2007/0020483 | A1 | 1/2007 | Park et al. |
| 2007/0040161 | A1 | 2/2007 | Kumaki et al. |
| 2007/0090376 | A1 | 4/2007 | Kumaki et al. |
| 2007/0114512 | A1 | 5/2007 | Kumaki et al. |
| 2007/0114527 | A1 | 5/2007 | Kumaki et al. |
| 2007/0200125 | A1 | 8/2007 | Ikeda et al. |
| 2007/0210322 | A1 | 9/2007 | Ohsawa et al. |
| 2008/0278064 | A1 | 11/2008 | Kumaki et al. |
| 2010/0301317 | A1 | 12/2010 | Nowatari et al. |

FOREIGN PATENT DOCUMENTS

| | | |
|---|---|---|
| JP | 2007-179933 | 7/2007 |
| JP | 2009-043612 | 2/2009 |
| WO | WO 01/15244 | 3/2001 |
| WO | 2007/064009 | 6/2007 |
| WO | WO 2007/130047 | 11/2007 |

OTHER PUBLICATIONS

Tsutsui et al., "Electric field-assisted bipolar charge spouting in organic thin-film diodes," Appl. Phys. Lett. (Applied Physics Letters), vol. 84, No. 3, pp. 440-442, Jan. 19, 2004.

Ikeda et al., "P-185: Low-Drive-Voltage OLEDs with a Buffer Layer Having Molybdenum Oxide," SID Digest '06: SID International Symposium Digest of Technical Papers, vol. 37, pp. 923-926, 2006.

Birnstock et al., "54.3: *Distinguished Paper:* White Stacked OLED with 35 lm/W and 100,000 Hours Lifetime at 1000 cd/m² for Display and Lighting Applications," SID Digest '08: SID International Symposium Digest of Technical Papers, vol. 39, pp. 822-825, May 20, 2008.

Kanno et al., "High Efficiency Stacked Organic Light-Emitting Diodes Employing $Li_2O$ as a Connecting Layer," Jpn. J. Appl. Phys. (Japanese Journal of Applied Physics), vol. 45, No. 12, pp. 9219-9223, Dec. 7, 2006.

Nowatari et al., "60.2: Intermediate Connector with Suppressed Voltage Loss for White Tandem OLEDs," SID Digest '09: SID International Symposium Digest of Technical Papers, pp. 899-902, vol. XV, Book II, Jun. 2009.

Chang et al., "Highly efficient white organic electroluminescent devices based on tandem architecture," Appl. Phys. Lett. (Applied Physics Letters), vol. 87, No. 25, pp. 253501-1-253501-3, Dec. 12, 2005.

Kanno et al., "White Stacked Electrophosphorescent Organic Light-Emitting Devices Employing $MoO_3$ as a Charge-Generation Layer," Adv. Mater. Advanced Materials), vol. 18, No. 3, pp. 339-342, 2006.

Terai et al., "Electric-field-assisted bipolar charge generation from internal charge separation zone composed of doped organic bilayer," Appl. Phys. Lett. (Applied Physics Letters), vol. 90, pp. 083502-1-083502-3, Feb. 21, 2007.

Law et al., "Effective organic-based connection unit for stacked organic light-emitting devices," Appl. Phys. Lett. (Applied Physics Letters), vol. 89, No. 13, pp. 133511-1-133511-3, Sep. 28, 2006.

Leem et al., "Highly efficient tandem *p-i-n* organic light-emitting diodes adopting a low temperature evaporated rhenium oxide interconnecting layer," Appl. Phys. Lett. (Applied Physics Letters), vol. 93, No. 10, pp. 103304-1-103304-3 Sep. 8, 2008.

Lai et al., "Copper hexadecafluorophthalocyanine and copper phthalocyanine as a pure organic connecting unit in blue tandem organic light-emitting devices," J. Appl. Phys. (Journal of Applied Physics), vol. 101, pp. 014509-1-014509-4, Jan. 12, 2007.

Liao et al., "Power efficiency improvement in a tandem organic light-emitting diode," Appl. Phys. Lett. (Applied Physics Letters), vol. 92, No. 22, pp. 223311-1-223311-3, Jun. 6, 2008.

Chan et al., "Influences of Connecting Unit Architecture on the Performance of Tandem Organic Light-Emitting Devices," Adv. Funct. Mater. (Advanced Functional Materials), vol. 17, No. 14, pp. 2509-2514, 2007.

Hiramoto et al., "*p-i-n* like behavior in three-layered organic solar cells having a co-deposited interlayer of pigments," J. Appl. Phys. (Journal of Applied Physics), vol. 72, No. 8, pp. 3781-3787, Oct. 15, 1992.

Brabec et al., "Photovoltaic properties of conjugated polymer/methanofullerene composites embedded in a polystyrene matrix," J. Appl. Phys. (Journal of Applied Physics), vol. 85, No. 9, pp. 6866-6872, May 1, 1999.

Matsumoto et al., "27.5L: Late-News Paper: Multiphoton Organic EL device having Charge Generation Layer," SID Digest '03: SID International Symposium Digest of Technical Papers, vol. 34, pp. 979-981, 2003.

Nowatari et al., "60.2: Intermediate Connector with Suppressed Voltage Loss for White Tandem OLEDs," SID Digest '09: SID International Symposium Digest of Technical Papers, pp. 899-902, vol. XL, Book II, Jun. 2009.

* cited by examiner

FIG. 9A
FIG. 9B  FIG. 9C
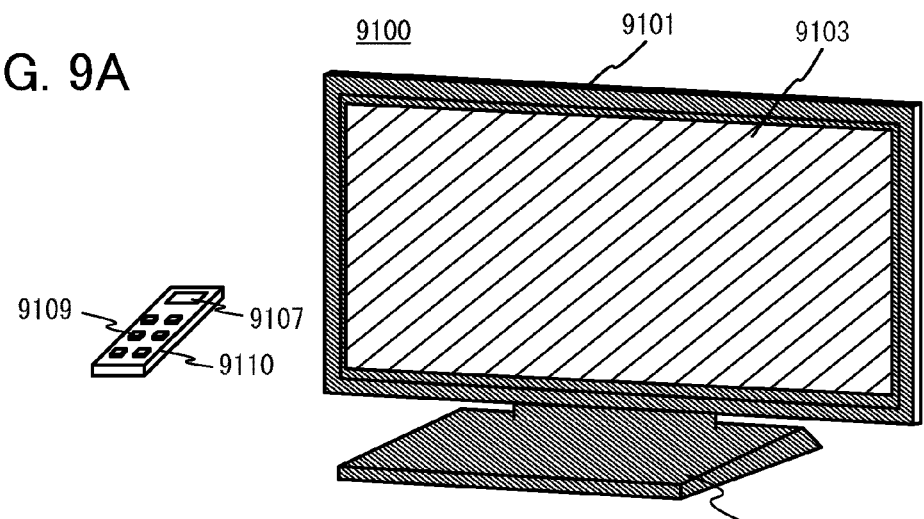
FIG. 9D  FIG. 9E
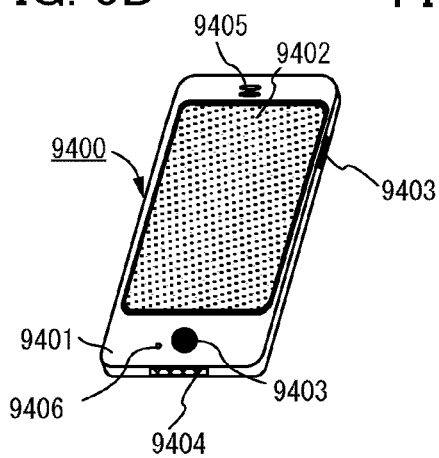
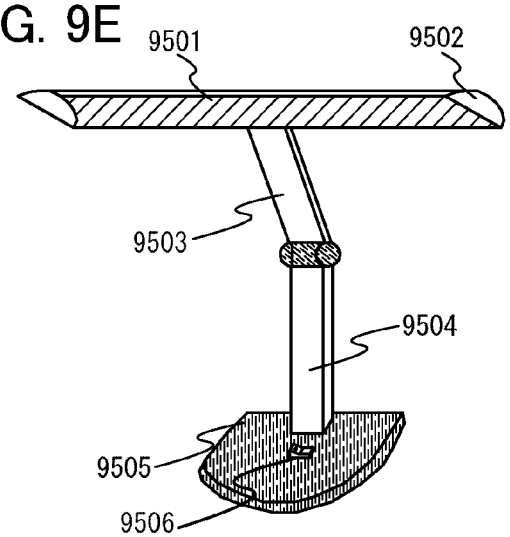

LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

The present invention relates to a light-emitting element in which an organic compound is provided between a pair of electrodes and the organic compound exhibits luminescence by application of an electric field. Further, the present invention relates to a light-emitting device having such a light-emitting element. Furthermore, the present invention relates to an electronic device and a lighting device having such a light-emitting device.

2. Description of the Related Art

A light-emitting element using an organic compound as a luminous body, which has features such as thinness, lightness, high-speed response, and DC drive at a low voltage, is expected to be applied to a next-generation flat panel display. In particular, a display device in which light-emitting elements are arranged in matrix is considered to have advantages in a wide viewing angle and excellent visibility over a conventional liquid crystal display device.

It is considered that the light emission mechanism of a light-emitting element is as follows: by applying a voltage between a pair of electrodes with an EL layer including a light emitter interposed therebetween, electrons injected from a cathode and holes injected from an anode recombine at a luminescent center of a light-emitting layer in the EL layer to form a molecular exciton, and energy is released to emit light when the molecular exciton relaxes to the ground state. Singlet excitation and triplet excitation are known as excited states, and light emission can probably be achieved through either of the excited states.

In order to improve element characteristics of such a light-emitting element, an improvement of an element structure, a development of a material, and the like have been actively conducted.

For example, there is a report that an electron-injection layer in contact with a cathode is formed by doping an organic compound with a metal having a low work function, such as an alkali metal, an alkaline earth metal, or a rare earth metal to reduce an injection barrier in injection of electrons from the cathode into the electron-injection layer, whereby drive voltage is decreased (e.g., see Patent Document 1).

In relation to this technique, it is also reported that an optical adjustment of an emission spectrum can be conducted without a drive voltage increase (e.g., see Patent Document 2).

Specifically, a light-emitting element is formed to have, between its cathode and EL layer, a layer that is in contact with the cathode and formed by doping a hole-transport organic compound with a metal oxide, and a layer that is in contact with the layer formed by doping the hole-transport organic compound with the metal oxide and formed by doping an electron-transport organic compound with a metal having a low work function, such as an alkali metal, an alkaline earth metal, or a rare earth metal. The layer formed by doping the hole-transport organic compound with the metal oxide has a large thickness to enable the optical adjustment of an emission spectrum. In this case, because the hole-transport organic compound has higher carrier mobility than the electron-transport organic compound, a drive voltage increase can be more suppressed than when the layer formed by doping an electron-transport organic compound with a metal having a low work function has a large thickness.

[Patent Document 1] Japanese Published Patent Application No. H10-270171
[Patent Document 2] Japanese Published Patent Application No. 2005-209643

SUMMARY OF THE INVENTION

Thus, suppressing a drive voltage increase is important in reducing power consumption of a light-emitting device having a light-emitting element, as well as in improving properties of a light-emitting element.

In view of the above-described problem, an object of one embodiment of the present invention is to provide a light-emitting element in which a drive voltage increase can be suppressed. In addition, another object is to provide a light-emitting device that has reduced power consumption by including such a light-emitting element.

Still another object of one embodiment of the present invention is to provide a light-emitting element in which suppression of a drive voltage increase is achieved even when the thickness of a layer provided between electrodes of a light-emitting element is changed. In addition, yet another object is to provide a light-emitting device that has reduced power consumption by including such a light-emitting element.

Another object of one embodiment of the present invention is to provide a light-emitting element in which suppression of a drive voltage increase is achieved even when the thickness of a layer provided between electrodes of a light-emitting element is changed so that optical adjustment can be conducted. Still another object is to provide a light-emitting device that has reduced power consumption and excellent color purity by including such a light-emitting element.

The present invention provides, in an embodiment for achieving the above objects, a light-emitting element having an adjusting layer and an EL layer between an anode and a cathode.

Between the cathode and the EL layer, the adjusting layer includes a first layer (charge generation layer) capable of carrier generation, a second layer (electron-relay layer) which accepts and transports the electrons generated in the first layer, and a third layer (electron-injection buffer) which injects the electrons accepted from the second layer into the EL layer. Furthermore, the first layer is in contact with the cathode, the second layer is in contact with the first layer, and the third layer is in contact with the second layer.

The EL layer may include at least a light-emitting layer and may have a stack structure in which layers other than the light-emitting layer are formed. As the layers other than the light-emitting layer, there are layers formed of a substance having a high hole-injection property, a substance having a high hole-transport property, a substance having a high electron-transport property, a substance having a high electron-injection property, a substance having a bipolar property (a substance having a high electron-and-hole-transport property), or the like. Specifically, a hole-injection layer, a hole-transport layer, a hole-blocking layer, an electron-transport layer, an electron-injection layer, and the like are given, and such layers can be combined as appropriate and stacked from the anode side. In the EL layer, a charge generation region can be further provided so as to be in contact with the anode.

Note that the first layer is formed so as to include a substance having a hole-transport property, which is preferably a substance having a high hole-transport property, and an acceptor substance, and holes of the carriers generated in the first layer are injected into the cathode while electrons are injected into the second layer.

Further, the second layer is formed to include a first donor substance and a first substance having an electron-transport property, which is preferably a substance having a high electron-transport property, with a slightly higher LUMO level (preferably, −5.0 eV or more, more preferably from −5.0 eV to −3.0 eV) than the acceptor level of the acceptor substance included in the first layer. Accordingly, electron transfer from the first layer to the second layer is facilitated.

In addition, the third layer is formed to include a second donor substance and a second substance having an electron-transport property, which is preferably a substance having a high electron-transport property. Accordingly, an injection bather in injection of electrons into the EL layer can be reduced.

A specific structure of one embodiment of the present invention is a light-emitting element that includes an EL layer and an adjusting layer between an anode and a cathode, and between the cathode and the EL layer, a first layer including a substance having a high hole-transport property and an acceptor substance and being in contact with the cathode, a second layer including a first donor substance and a first substance having a high electron-transport property and being in contact with the first layer, and a third layer including a second donor substance and a second substance having a high electron-transport property and being in contact with the second layer and with the EL layer, in which the LUMO level of the first substance is lower than the that of the second substance.

Note that in the above structure, the EL layer may further include a fourth layer including a substance having a high electron-transport property, and the fourth layer is in contact with the third layer.

In the above structure, the acceptor substance is added so that the weight ratio of the acceptor substance to the substance having a high hole-transport property is greater than or equal to 0.1:1 and less than or equal to 4.0:1 in the first layer.

In the above structure, the first layer has a stack structure of a layer including the substance having a high hole-transport property and a layer including the acceptor substance.

In the above structure, the first donor substance is added so that the weight ratio of the first donor substance to the first substance having a high electron-transport property is greater than or equal to 0.001:1 and less than or equal to 0.1:1 in the second layer.

In the above structure, the substance having a high electron-transport property included in the second layer has a LUMO level of −5.0 eV or more.

In the above structure, the first substance having a high electron-transport property included in the second layer is a perylene derivative or a nitrogen-containing condensed aromatic compound.

In the above structure, the second donor substance is added so that the weight ratio of the second donor substance to the second substance is greater than or equal to 0.001:1 and less than or equal to 0.1:1 in the third layer.

In the above structure, at least one of the first donor substance and the second donor substance is an alkali metal, an alkaline earth metal, a rare earth metal, an alkali metal compound, an alkaline earth metal compound, or a rare earth metal compound.

In the above structure, the EL layer includes a fifth layer including a substance having a high hole-transport property and an acceptor substance, and the fifth layer is in contact with the anode.

In the above structure, the acceptor substance is added so that a weight ratio of the acceptor substance to the substance having a high hole-transport property is greater than or equal to 0.1:1 and less than or equal to 4.0:1 in the fifth layer.

In the above structure, the fifth layer has a stack structure of a layer including the substance having a high hole-transport property and a layer including the acceptor substance.

In the above structure, the acceptor substance is a transition metal oxide or an oxide of a metal belonging to Group 4 to Group 8 of the periodic table.

Further, the present invention covers an electronic device and a lighting device which have a light-emitting device as well as a light-emitting device having a light-emitting element. Thus, the term light-emitting device in this specification means an image display device, a light-emitting device, a light source (including a lighting device), and the like. Further, the category of the light-emitting device includes a module in which a connector such as a flexible printed circuit (FPC), a tape automated bonding (TAB) tape, or a tape carrier package (TCP) is attached to a light-emitting device, a module in which the top of a TAB tape or a TCP is provided with a printed wiring board, and a module in which an integrated circuit (IC) is directly mounted on a light-emitting element by a chip on glass (COG) technique.

Thus, a light-emitting element in which suppression of a drive voltage increase is achieved can be provided. Further, a light-emitting device, an electronic device, and a lighting device which have reduced power consumption by including such a light-emitting element can be provided.

In addition, because even changes in the thickness of the first layer do not cause a drive voltage increase, it is possible to provide a light-emitting element in which suppression of a drive voltage increase is achieved even with variations in the total thickness of layers between electrodes of the light-emitting element. Further, a light-emitting device which has reduced power consumption by including such a light-emitting element can be provided.

Moreover, since even changes in the thickness of the first layer do not cause a drive voltage increase, it is possible to provide a light-emitting element in which suppression of a drive voltage increase is achieved even with variations in the thickness of layers between electrodes for optical adjustment of an emission spectrum. Therefore, a light-emitting device which has reduced power consumption and excellent color purity by including such a light-emitting element can be provided.

BRIEF DESCRIPTION OF THE DRAWINGS

FIGS. 9A to 9E illustrate electronic devices.

DETAILED DESCRIPTION OF THE INVENTION

Hereinafter, embodiments of the present invention will be described using the accompanying drawings. Note that the present invention is not limited to the description below, and the modes and details of the present invention can be easily modified in various ways by those skilled in the art without departing from the spirit and scope of the present invention. Therefore, the embodiments of the present invention should not be construed as being limited to the description of the embodiment modes and examples below.

Embodiment 1

In this embodiment, an element structure of a light-emitting element which is an example of the present invention is described with reference to FIGS. 1A and 1B.

The light-emitting element described in this embodiment has an adjusting layer 108 and an EL layer 103 between a cathode and an anode.

Figure 1A:
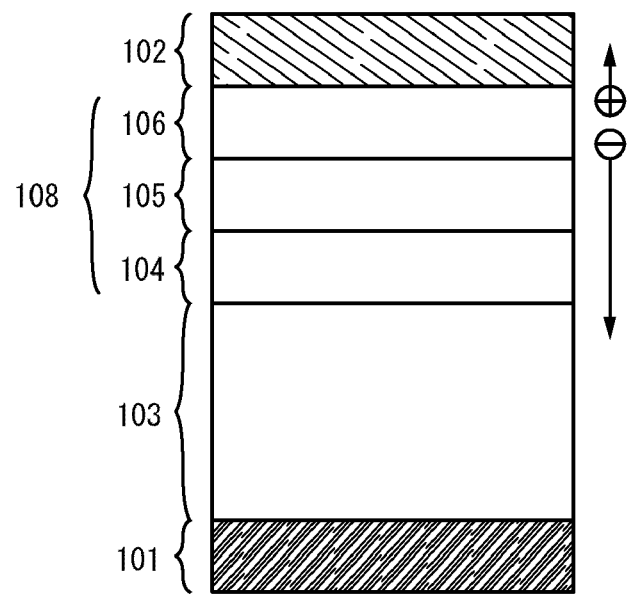
FIGS. 1A and 1B illustrate an element structure of a light-emitting element and a band diagram thereof respectively.

In the element structure illustrated in FIG. 1A, an EL layer 103 including an emission region is disposed between a pair of electrodes (an anode 101 and a cathode 102). Between the cathode 102 and the EL layer 103, the following layers are sequentially stacked from the cathode 102 side: a charge generation region 106 which is a first layer capable of carrier generation, an electron-relay layer 105 which is a second layer accepting and transporting the electrons generated in the charge generation region 106, and an electron-injection buffer 104 which is a third layer injecting the electrons accepted from the electron-relay layer 105 into the EL layer.

Note that holes and electrons which are carriers of the light-emitting element are generated in the charge generation region 106, and the holes are transferred to the cathode 102 while the electrons are transferred to the electron-relay layer 105. The electron-relay layer 105 has a high electron-transport property, and thus can rapidly transport electrons to the electron-injection buffer 104. Furthermore, since the electron-injection buffer 104 can reduce an injection barrier in injection of electrons into the EL layer 103, the efficiency of the electron injection into the EL layer 103 can be improved.

Figure 1B:
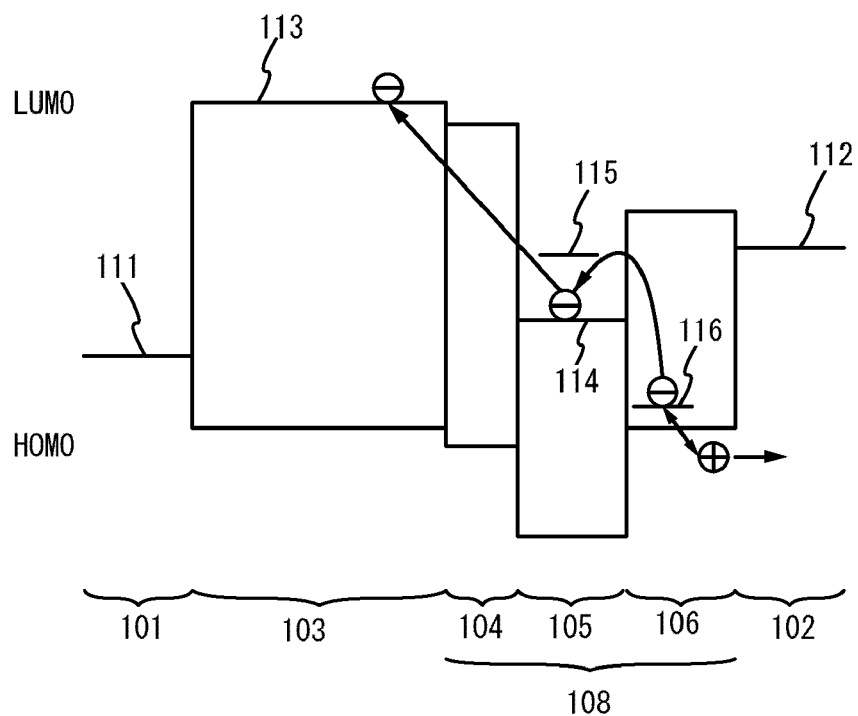

FIG. 1B is a band diagram of the element structure illustrated in FIG. 1A. In FIG. 1B, reference numeral 111 represents a Fermi level of the anode 101, 112 a Fermi level of the cathode 102, 113 a LUMO (lowest unoccupied molecular orbital) level of the EL layer 103, 114 a LUMO level of the electron-relay layer 105, 115 a donor level of a first donor substance in the electron-relay layer 105, and 116 an acceptor level of an acceptor substance in the charge generation region 106.

Note that, since the electron-relay layer 105 functions as a layer for efficiently injecting electrons generated in the charge generation region 106 into the EL layer 103, the LUMO level 114 of the electron-relay layer 105 and the donor level 115 of the first donor substance in the electron-relay layer 105 each have a level between the acceptor level 116 of the acceptor substance in the charge generation region 106 and the LUMO level 113 of the EL layer 103. Specifically, it is preferable that each of the LUMO level 114 and the donor level 115 be approximately −5.0 eV to −3.0 eV.

Further, as illustrated in the band diagram of FIG. 1B, the electrons that have been transferred from the charge generation region 106 to the electron-relay layer 105 are easily injected into the LUMO level 113 of the EL layer 103, because of the reduction in injection barrier due to the electron-injection buffer 104. Note that the holes generated in the charge generation region 106 are transferred to the cathode 102.

Next, materials that can be used for the above-described light-emitting element are specifically described.

For the anode 101, a metal, an alloy, an electrically-conductive compound, a mixture thereof, or the like having a high work function (specifically, a work function of 4.0 eV or more) is preferably used. Specifically, there are indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide, and the like.

Such conductive metal oxide films are usually formed by a sputtering method, but may also be formed by application of a sol-gel method or the like. For example, a film of indium oxide-zinc oxide (IZO) can be formed by a sputtering method using a target in which indium oxide contains 1 wt % to 20 wt % zinc oxide. A film of indium oxide containing tungsten oxide and zinc oxide can be formed by a sputtering method using a target in which indium oxide contains 0.5 wt % to 5 wt % tungsten oxide and 0.1 wt % to 1 wt % zinc oxide.

Besides, as a material used for the anode 101, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used. Note that, when the charge generation region is provided in contact with the anode 101, a variety of conductive materials such as Al and Ag can be used for the anode 101 regardless of the work function.

For the cathode 102, a metal, an alloy, an electrically-conductive compound, a mixture thereof, or the like having a low work function (specifically, a work function of 3.8 eV or less) can be used. Typical examples of such cathode materials include: elements belonging to Group 1 and Group 2 in the periodic table, i.e., alkali metals such as lithium (Li) and cesium (Cs), and alkaline earth metals such as magnesium (Mg), calcium (Ca), and strontium (Sr); alloys containing any of these (such as MgAg and AlLi); rare earth metals such as europium (Eu) and ytterbium (Yb); alloys containing such a rare earth metal; and the like. Note that a film of an alkali metal, an alkaline earth metal, or an alloy thereof can be formed by a vacuum evaporation method. Alternatively, a film of an alloy containing an alkali metal or an alkaline earth metal can be formed by a sputtering method. Alternatively, a film made from silver paste or the like can be formed by an inkjet method or the like.

Alternatively, the cathode 102 can be formed by stacking a film of a metal such as aluminum, and a thin film of an alkali metal compound, an alkaline earth metal compound, or a rare earth metal compound (e.g., lithium fluoride (LiF), lithium oxide (LiOx), cesium fluoride (CsF), calcium fluoride ($CaF_2$), or erbium fluoride ($ErF_3$)). However, when the charge generation region is provided in contact with the cathode 102 as in the structure of this embodiment, a variety of conductive materials such as Al, Ag, ITO, and indium oxide-tin oxide containing silicon or silicon oxide can be used for the cathode 102 regardless of the work function.

Note that in the light-emitting element described in this embodiment, at least either the anode or the cathode may have a light-transmitting property. The light-transmitting property can be ensured with use of a transparent electrode such as ITO, or a reduction in the thickness of an electrode.

The EL layer 103 includes at least a light-emitting layer, and may also have a structure in which layers other than the light-emitting layer are stacked. As the layers other than the light-emitting layer, there are layers formed of a substance having a high hole-injection property, a substance having a high hole-transport property, a substance having a high electron-transport property, a substance having a high electron-injection property, a substance having a bipolar property (a substance having a high electron-and-hole-transport property), or the like. Specifically, a hole-injection layer, a hole-transport layer, a hole-blocking layer, an electron-transport layer, an electron-injection layer, and the like are given. Such layers can be combined as appropriate and stacked from the anode side. Furthermore, a charge generation region can be provided in part of the EL layer 103, which is on the side where the EL layer 103 is in contact with the anode 101.

Materials for forming the layers included in the EL layer 103 are specifically described.

The hole-injection layer is a layer having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesufonate) (PEDOT/PSS), or the like to form the hole-injection layer.

The hole-transport layer is a layer that contains a substance having a high hole-transport property. As the material having a high hole-transport property, the following can be given, for example: aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Alternatively, the following carbazole derivative can be used: 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)phenyl]-10-phenylanthracene (abbreviation: CzPA), and the like. The substances mentioned here are mainly ones that have a hole mobility of $10^{-6}$ cm$^2$/V·s or more. However, other substances than the above described materials may also be used as long as the substances have higher hole-transport properties than electron-transport properties. Note that the layer that contains a substance having a high hole-transport property is not limited to a single layer and may have a stack of two or more layers containing any of the above substances.

In addition to the above substances, a high molecular compound such as poly(N-vinylcarbazole) (abbreviation: PVK), poly(4-vinyltriphenylamine) (abbreviation: PVTPA), poly [N-(4-{N'-[4-(4-diphenylamino)phenyl]phenyl-N'-phenylamino}phenyl)methacrylamie] (abbreviation: PTPDMA), or poly[N,N'-bis(4-butylphenyl)-N,N'-bis(phenyl) benzidine] (abbreviation: Poly-TPD) can be used for the hole-transport layer.

The light emitting layer is a layer containing a light emitting substance. As the light-emitting substance, the following fluorescent compound can be used, for example: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-antryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'''-(2-tert-butylanthracene-9,10-diyldi-4,1-phenylene)bis [N,N',N'-triphenyl-1,4-phenylenediamine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N', N",N",N''',N'''-octaphenyldibenzo[g,p]chrysene-2,7,10,15-tetraamine (abbreviation: DBC1), coumarin 30, 9,10-diphenyl-2-[N-phenyl-N-(9-phenyl-9H-carbazol-3-yl) amino]anthracene (abbreviation: 2PCAPA), N-[9,10-bis(1, 1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl] ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis (4-methylphenyl)acenaphtho[1,2-a]fluoranthene-3,10-diamine (abbreviation: p-mPhAFD), 2-{2-isopropyl-6-[2-(1,1, 7,7-tetramethyl-2,3,6,7-tetrahydro-1H,5H-benzo[ij] quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis [2-(8-methoxy-1,1,7,7-tetramethyl-2,3,6,7-tetrahydro-1H, 5H-benzo[ij]quinolizin-9-yl)ethenyl]-4H-pyran-4-ylidene}propanedinitrile (abbreviation: BisDCJTM), and the like.

As the light-emitting substance, the following phosphorescent compound can be used, for example: bis[2-(4',6'-difluorophenyl)pyridinato-N,$C^{2'}$]iridium(III) tetrakis(1-pyrazolyl) borate (abbreviation: FIr6), bis[2-(4',6'-difluorophenyl) pyridinato-N, $C^{2'}$]iridium(III)picolinate (abbreviation:

FIrpic), bis[2-(3',5'-bistrifluoromethylphenyl)pyridinato-N,C$^{2'}$]iridium(III)picolinate (abbreviation: Ir(CF$_3$ppy)$_2$(pic)), bis[2-(4',6'-difluorophenyl)pyridinato-N,C$^{2'}$]iridium(III) acetylacetonate (abbreviation: FIracac), tris(2-phenylpyridinato)iridium(III) (abbreviation: Ir(ppy)$_3$), bis(2-phenylpyridinato)iridium(III)acetylacetonato (abbreviation: Ir(ppy)$_2$(acac)), bis(benzo[h]quinolinato)iridium(III)acetylacetonate (abbreviation: Ir(bzq)$_2$(acac)), bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III) acetylacetonate (abbreviation: Ir(bt)$_2$(acac)), bis[2-(2'-benzo[4,5-α]thienyl)pyridinato-N,C$^{3'}$]iridium(III) acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum(II) (abbreviation: PtOEP), tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)3 (Phen)), tris[1-(2-thenoyl)-3,3,3-trifluoroacetonato](monophenanthroline)europium(III) (abbreviation: Eu(TTA)$_3$(Phen)), and the like.

Note that preferable use of a light-emitting substance as shown above is achieved by dispersion of it in a host material. As the host material, for example, the following can be used: an aromatic amine compound such as NPB, TPD, TCTA, TDATA, MTDATA, or BSPB (abbreviations); a carbazole derivative such as PCzPCA1, PCzPCA2, PCzPCN1, CBP, TCPB, or CzPA (abbreviations); a substance having a high hole-transport property which contains a high molecular compound, such as PVK, PVTPA, PTPDMA, or Poly-TPD (abbreviations); a metal complex having a quinoline skeleton or a benzoquinoline skeleton, such as tris(8-quinolinolato)aluminum (abbreviation: Alq), tris (4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolate)aluminum (abbreviation: BAlq); a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$); or a substance having a high electron-transport property, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP).

The electron-transport layer is a layer that contains a substance having a high electron-transport property. As the substance having a high electron-transport property, for example, a metal complex having a quinoline skeleton or a benzoquinoline skeleton, such as Alq, Almq$_3$, BeBq$_2$, or BAlq (abbreviations) can be used. In addition to the above, a metal complex having an oxazole-based or thiazole-based ligand, such as Zn(BOX)$_2$ or Zn(BTZ)$_2$ (abbreviations) can also be used. Furthermore, in addition to the metal complexes, PBD, OXD-7, CO11, TAZ, BPhen, BCP (abbreviations), or the like can also be used. The substances mentioned here are mainly ones that have an electron mobility of $10^{-6}$ cm$^2$/V·s or more. Note that substances other than those may be used as long as they have an electron-transport property higher than a hole-transport property. Furthermore, the electron-transport layer is not limited to a single layer and may have a stack of two or more layers containing any of the above substances.

Besides the above-described materials, a high molecular compound such as poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used for the electron-transport layer.

The electron-injection layer is a layer that contains a substance having a high electron-injection property. As the material having a high electron-injection property, the following can be given: an alkali metal or an alkaline earth metal such as lithium fluoride (LiF), cesium fluoride (CsF), and calcium fluoride (CaF$_2$), and a compound thereof. Alternatively, a layer containing an electron-transport substance and an alkali metal, an alkaline earth metal, or a compound thereof, e.g., a layer of Alq which contains magnesium (Mg), can be used. Such a structure makes it possible to further enhance the efficiency of electron injection from the cathode 102.

Further, the charge generation region that can be provided in contact with the anode 101 or the cathode 102 as described above is a region that contains a substance having a high hole-transport property and an acceptor substance. The charge generation region is not limited to the structure in which one film contains the substance having a high hole-transport property and the acceptor substance, and may be a stack of a layer containing the substance having a high hole-transport property and a layer containing the acceptor substance. Note that, when the charge generation region has a stack structure provided on the anode side, the layer containing the acceptor substance is in contact with the anode 101. When the charge generation region has a stack structure on the cathode side, the layer containing the substance having a high hole-transport property is in contact with the cathode 102.

As the acceptor substance used for the charge generation region, transition metal oxides and oxides of metals belonging to Group 4 to Group 8 of the periodic table can be given. In particular, molybdenum oxide is preferable because it has a low hygroscopic property.

As the substance having a high hole-transport property which is used for the charge generation region, any of a variety of organic compounds such as aromatic amine compounds, carbazole derivatives, aromatic hydrocarbons, or high molecular compounds (such as oligomers, dendrimers, or polymers) can be used. Specifically, a substance having a hole mobility of $10^{-6}$ cm$^2$/Vs or more is preferably used. However, substances other than the above described materials may also be used as long as the substances have higher hole-transport properties than electron-transport properties.

The EL layer 103 can be formed by stacking such layers in appropriate combination. Further, as a formation method of the EL layer 103, any of a variety of methods (e.g., a dry process and a wet process) can be selected as appropriate depending on a material to be used. For example, a vacuum evaporation method, an inkjet method, a spin coating method, or the like can be used. Note that a different formation method may be employed for each layer.

Further, between the cathode 102 and the EL layer 103, the electron-injection buffer 104, the electron-relay layer 105, and the charge generation region 106 are provided. The charge generation region 106 is formed in contact with the cathode 102, the electron-relay layer 105 is formed in contact with the charge generation region 106, and the electron-injection buffer 104 is formed in contact with and between the electron-relay layer 105 and the EL layer 103.

The charge generation region 106 is a region that contains a substance having a high hole-transport property and the acceptor substance. Note that the charge generation region 106 can be formed such that the material and structure thereof are the same as those of the above-described charge generation region that can be formed in part of the EL layer 103. Thus, the charge generation region 106 is not limited to the structure in which one film contains the substance having a high hole-transport property and the acceptor substance, and can be a stack of a layer containing the substance having a high hole-transport property and a layer containing the acceptor substance. Note that, when the charge generation region 106 has a stack structure, the layer containing the substance having a high hole-transport property is in contact with the cathode 102.

Note that, in the charge generation region 106, the acceptor substance is preferably added so that the weight ratio of the acceptor substance to the substance having a high hole-transport property is from 0.1:1 to 4.0:1.

The electron-relay layer 105 is a layer that can rapidly accept electrons attracted by the acceptor substance in the charge generation region 106. Thus, the electron-relay layer 105 contains the first donor substance and the first substance having a high electron-transport property with a LUMO level higher than the acceptor level of the acceptor substance contained in the charge generation region 106.

Note that, in the electron-relay layer 105, the first donor substance is preferably added so that the weight ratio of the first donor substance to the first substance having a high electron-transport property is from 0.001:1 to 0.1:1. Accordingly, the electron-relay layer 105 can carry out its function.

Examples of the first donor substance used for the electron-relay layer 105 include an alkali metal, an alkaline earth metal, a rare earth metal, a compound thereof (including an alkali metal compound (including an oxide such as lithium oxide, a halide, and carbonate such as lithium carbonate or cesium carbonate), an alkaline earth metal compound (including an oxide, a halide, and carbonate), and a rare earth metal compound (including an oxide, a halide, and carbonate)), as well as an organic compound such as tetrathianaphthacene (abbreviation: TTN), nickelocene, and decamethylnickelocene.

In addition, as the first substance having a high electron-transport property which is used for the electron-relay layer 105, specifically, it is preferable to use a substance having a LUMO level greater than or equal to −5.0 eV, more preferably a LUMO level of −5.0 eV to −3.0 eV. Examples of the first substance having a high electron-transport property for the electron-relay layer 105 include perylene derivatives and nitrogen-containing condensed aromatic compounds. Note that, because of their stability, nitrogen-containing condensed aromatic compounds are preferable for the electron-relay layer 105. Furthermore, the compounds which further facilitate reception of electrons in the electron-relay layer 105 among the nitrogen-containing condensed aromatic compounds are compounds having an electron-withdrawing group such as a cyano group or a fluoro group.

Specific examples of the perylene derivatives include 3,4, 9,10-perylenetetracarboxylic dianhydride (abbreviation: PTCDA), bisbenzimidazo[2,1-a:2',1'-a]anthra[2,1,9-def:6,5, 10-d'e'f']diisoquinoline-10,21-dione) (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: HexPTC), and the like.

As specific examples of the nitrogen-containing condensed aromatic compounds, the following can be given: pirazino[2, 3-f][1,10]phenanthroline-2,3-dicarbonitrile (abbreviation: PPDN), 2,3,6,7,10,11-hexacyano-1,4,5,8,9,12-hexaazatriphenylene (abbreviation: $HAT(CN)_6$), 2,3-diphenylpyrido[2,3-b]pyrazine (abbreviation: 2PYPR), 2,3-bis(4-fluorophenyl) pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: $F_{16}CuPc$), N,N'-bis(2,2, 3,3,4,4,5,5,6,6,7,7,8,8-pentadecafluorooctyl-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophen) (abbreviation: DCMT), methanofullerene such as [6,6]-phenyl C61 butyric acid methyl ester, or the like can be used for the electron-relay layer 105.

The electron-injection buffer 104 is a layer that can inject the electrons accepted by the electron-relay layer 105 into the EL layer 103. Because the provision of the electron-injection buffer 104 makes it possible to reduce the injection barrier between the charge generation region 106 and the EL layer 103, the electrons generated in the charge generation region 106 can be easily injected into the EL layer 103.

The electron-injection buffer 104 contains a second donor substance and the second substance having a high electron-transport property with a LUMO level higher than that of the first substance having a high electron-transport property which is contained in the electron-relay layer 105.

Further, in the electron-injection buffer 104, the second donor substance is preferably added so that the weight ratio of the second donor substance to the second substance having a high electron-transport property is from 0.001:1 to 0.1:1. Accordingly, the electron-injection buffer 104 can carry out its function.

The second donor substance used for the electron-injection buffer 104 can be similar to the first donor substance used for the electron-relay layer 105. The first donor substance and the second donor substance may be the same material or different materials. In addition, as the second substance having a high electron-transport property, a suitable material can be selected from the same materials as those for the above-described electron-transport layer which can be formed in part of the EL layer 103, as appropriate.

The light-emitting element described in this embodiment can be fabricated by combining materials as described above. This light-emitting element exhibits light emission from the above-described light-emitting substance, and a variety of emission colors can be obtained by changing the kind of light-emitting substance. In addition, by use of a plurality of light-emitting substances exhibiting different emission colors as the light-emitting substance, light emission having a broad spectrum or white emission can also be performed. Note that, in order to exhibit white emission, a stack of plural layers which emit light whose colors are complementary colors or the like can be employed. Specific examples of complementary colors include "blue and yellow", "blue green and red", and the like.

Further, the light-emitting element described in this embodiment can be formed over any of a variety of substrates. As the substrate, for example, a substrate made of glass, plastic, a metal plate, metal foil, or the like can be used. When light emission of the light-emitting element is extracted from the substrate side, a substrate having a light-transmitting property may preferably be used. Note that as the substrate, a substrate other than the above may be used as long as it can serve as a support in the fabrication process of the light-emitting element.

Note that the element structure of the light-emitting element described in this embodiment can be applied to manufacture of a passive matrix light-emitting device in which both electrodes are formed in a grid pattern over one substrate. Also, the element structure can be applied to an active matrix light-emitting device including a light-emitting element which is electrically connected to a thin film transistor (TFT) functioning as a switch, or the like and the driving of which is controlled by the TFT. Note that there is no particular limitation on the structure of the TFT. A staggered TFT or an inverted staggered TFT may be employed. In addition, a driver circuit formed of TFTs may be formed of n-type TFTs and p-type TFTs, or either n-type TFTs or p-type TFTs. There is no particular limitation on crystallinity of a semiconductor film used for the TFT, either. An amorphous semiconductor film may be used, or a crystalline semiconductor film may be used. Further, a single crystalline semiconductor film may be used. The single crystalline semiconductor film can be formed by a Smart Cut (registered trademark) method or the like. Further alternatively, an oxide semiconductor, for instance, an oxide semiconductor containing indium, gallium, and zinc can be used.

Further, the light-emitting element described in this embodiment can be formed by any of a variety of methods regardless of whether it is a dry process (e.g., a vacuum evaporation method) or a wet process (e.g., an inkjet method or a spin coating method).

The element structure described in this embodiment can make it difficult for the thickness of the charge generation region 106 to affect the drive voltage. Accordingly, an increase in the drive voltage of the light-emitting element can be suppressed, and an improvement of color purity by optical adjustment can be realized.

Embodiment 2

In this embodiment, an example of the light-emitting element included in the basic structure described in Embodiment 1 is described with reference to FIGS. 2A and 2B.

The light-emitting element described in this embodiment has the adjusting layer 108 and the EL layer 103 between the cathode and the anode, and includes the electron-transport layer in part of the cathode side of the EL layer. Note that one feature of this element is that the electron-injection buffer 104 which is part of the adjusting layer is extremely thin, as detailed below.

Figure 2A:
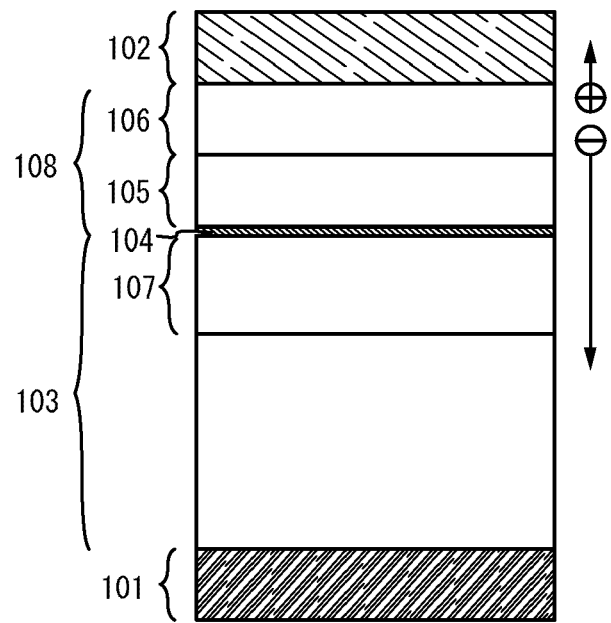
FIGS. 2A and 2B illustrate an element structure of a light-emitting element and a band diagram thereof respectively.

In the light-emitting element described in this embodiment illustrated in FIG. 2A, the EL layer 103 including an emission region is disposed between the pair of electrodes (the anode 101 and the cathode 102). Between the cathode 102 and the EL layer 103, the charge generation region 106, the electron-relay layer 105, and the electron-injection buffer 104 are stacked sequentially from the cathode 102 side. In addition, the electron-relay layer 105 contains the first donor substance and the substance having a high electron-transport property.

The materials for the anode 101, the cathode 102, the EL layer 103, the charge generation region 106, and the electron-relay layer 105 of this embodiment can be the same as those described in Embodiment 1.

In addition, as a substance used for the electron-injection buffer 104, the following can be given: substances having a high electron-injection property, such as alkali metals such as lithium (Li) and cesium (Cs); alkaline earth metals such as magnesium (Mg), calcium (Ca), and strontium (Sr); rare earth metals such as europium (Eu) and ytterbium (Yb); alkali metal compounds (including an oxide such as lithium oxide, a halide, and carbonate such as lithium carbonate and cesium carbonate); alkaline earth metal compounds (including an oxide, a halide, and carbonate), and rare earth metal compounds (including an oxide, a halide, and carbonate); and the like.

The substances which are stable in air among the substances described in this embodiment as the substance having a high electron-injection property for the electron-injection buffer 104 are alkali metal compounds (including oxides such as lithium oxide, halides, and carbonates such as lithium carbonate or cesium carbonate), alkaline earth metal compounds (including oxides, halides, and carbonates), rare earth metal compounds (including oxides, halides, and carbonates), are the like. Thus, the light-emitting element of this embodiment using such a substance is suitable for mass production.

Figure 2B:
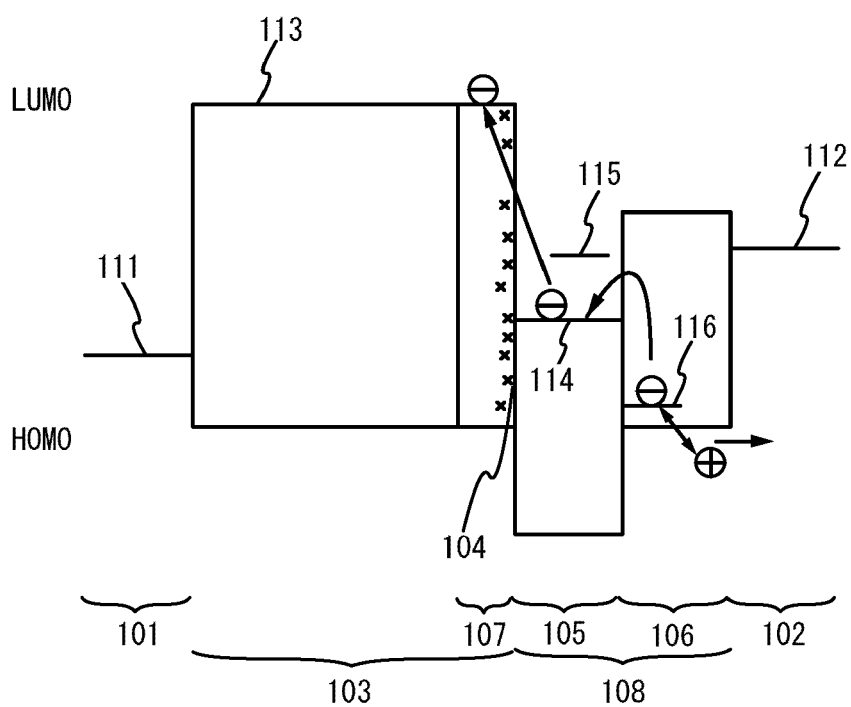

FIG. 2B is a band diagram in which the stacked layers of the element structure of FIG. 2A are sequentially stacked from the anode 101 side. That is, the electron-injection buffer 104 is provided at the interface between the electron-relay layer 105 and the EL layer 103. Therefore, the injection barrier between the charge generation region 106 and the EL layer 103 can be reduced, so that electrons generated in the charge generation region 106 can be easily injected into the EL layer 103. Note that holes generated in the charge generation region 106 are transferred to the cathode 102.

In the light-emitting element described in this embodiment, the EL layer 103 is formed over the anode 101, and then the electron-injection buffer 104, the electron-relay layer 105, and the charge generation region 106 are sequentially formed over the EL layer 103. The electron-injection buffer 104 is formed to a very small thickness (specifically, 1 nm or less) so that a drive voltage increase is prevented. Thus, the electron-injection buffer 104 is proximately located at the interface between the electron-relay layer 105 and the electron-transport layer 107 which is part of the EL layer 103. Note that, when the electron-injection buffer 104 is formed over the electron-transport layer 107 after the electron-transport layer 107 is formed, part of the substance forming the electron-injection buffer 104 can also exist in the electron-transport layer 107 that is part of the EL layer 103.

Note that the structure described in this embodiment can be combined with a structure described in Embodiment 1 as appropriate.

Embodiment 3

In this embodiment, an example of the light-emitting element included in the basic structure described in Embodiment 1 is described with reference to FIGS. 3A and 3B.

The light-emitting element described in this embodiment has the adjusting layer 108 and the EL layer 103 between the cathode and the anode, and includes the electron-transport layer 107 in part of the cathode side of the EL layer. Note that one feature of this element is that the electron-injection buffer 104 which is part of the adjusting layer is in contact with the electron-transport layer 107 which is part of the EL layer 103 as illustrated in FIG. 3A, as detailed below.

Figure 3A:
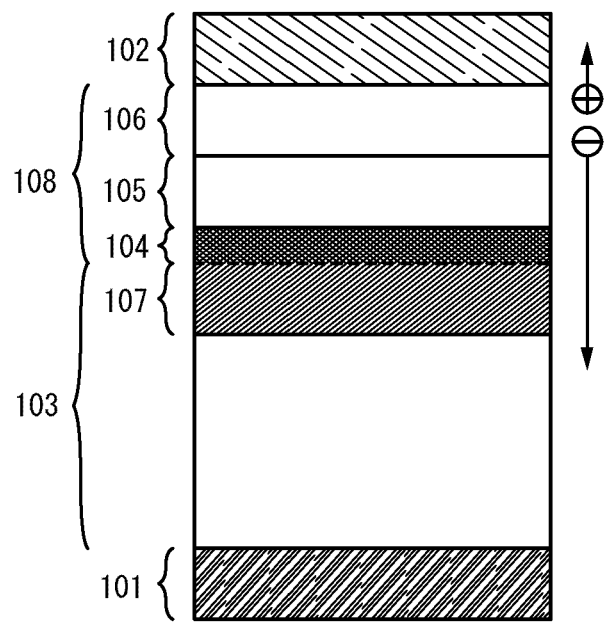
FIGS. 3A and 3B illustrate an element structure of a light-emitting element and a band diagram thereof respectively.
Figure 3B:
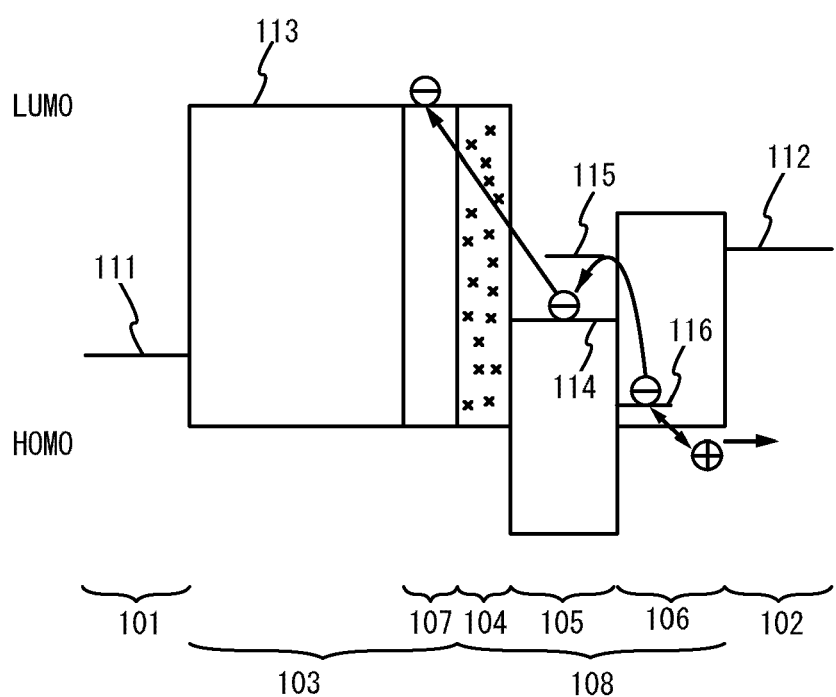

More specifically, as illustrated in FIG. 3A, the EL layer 103 including a light-emitting region is disposed between the pair of electrodes (the anode 101 and the cathode 102), and between the EL layer 103 and the cathode 102, the charge generation region 106, the electron-relay layer 105, and the electron-injection buffer 104 are stacked sequentially from the cathode 102 side. The electron-relay layer 105 is formed to include the first substance having a high electron-transport property and the first donor substance. The electron-injection buffer 104 is formed to include the second substance having a high electron-transport property and the second donor substance. In addition, the electron-transport layer 107 which is part of the EL layer 103 is in contact with the electron-injection buffer 104.

The materials for the anode 101, the cathode 102, the EL layer 103, the charge generation region 106, the electron-relay layer 105 and the electron-injection buffer 104 of this embodiment can be the same as those described in Embodiment 1.

Note that, in this embodiment, the second substance having a high electron-transport property which is contained in the electron-injection buffer 104 and the substance having a high electron-transport property which is used for the electron-transport layer 107 that is part of the EL layer 103 may be the same or different.

Thus, one feature of the light-emitting element described in this embodiment is that the electron-transport layer 107 which is part of the EL layer 103 is in contact with the electron-injection buffer 104 which contains the second substance having a high electron-transport property and the second donor substance, as illustrated in FIG. 3A. FIG. 3B is a band diagram of this element structure.

In other words, since provision of the electron-injection buffer 104 enables a reduction in the injection barrier between the electron-relay layer 105 and the EL layer 103, electrons generated in the charge generation region 106 can be easily injected into the EL layer 103. In addition, holes generated in the charge generation region 106 are transferred to the cathode.

Note that the structure described in this embodiment can be combined with a structure which is described in Embodiment 1 or Embodiment 2 as appropriate.

Embodiment 4

In this embodiment, as an example of the light-emitting element included in the basic structure described in Embodiment 1, the structure of the charge generation region 106 is described with reference to FIGS. 4A and 4B.

The light-emitting element described in this embodiment has the adjusting layer 108 and the EL layer 103 between the cathode and the anode. Note that one feature of this element is that the charge generation region 106 which is part of the adjusting layer may be a stack structure of a layer 106a containing a substance having a high hole-transport property and a layer 106b containing an acceptor substance as illustrated in FIG. 4B, as detailed below.

Figure 4A:
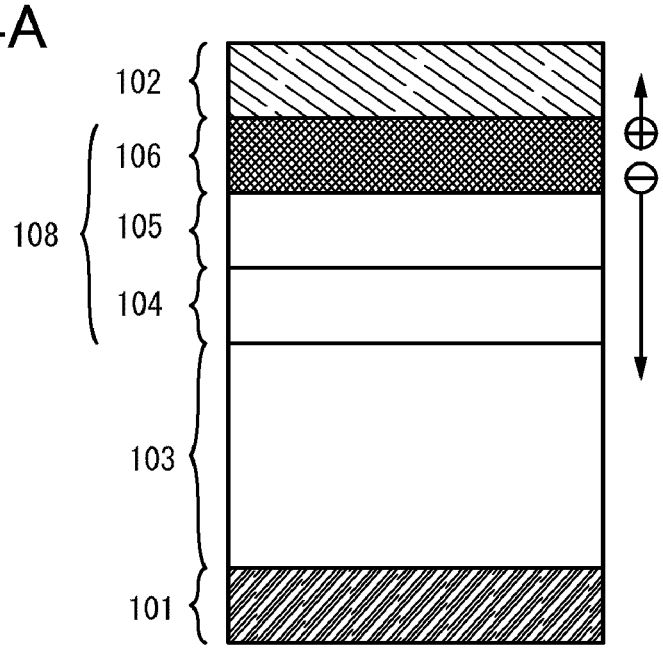
FIGS. 4A and 4B each illustrate an element structure of a light-emitting element.
Figure 4B:
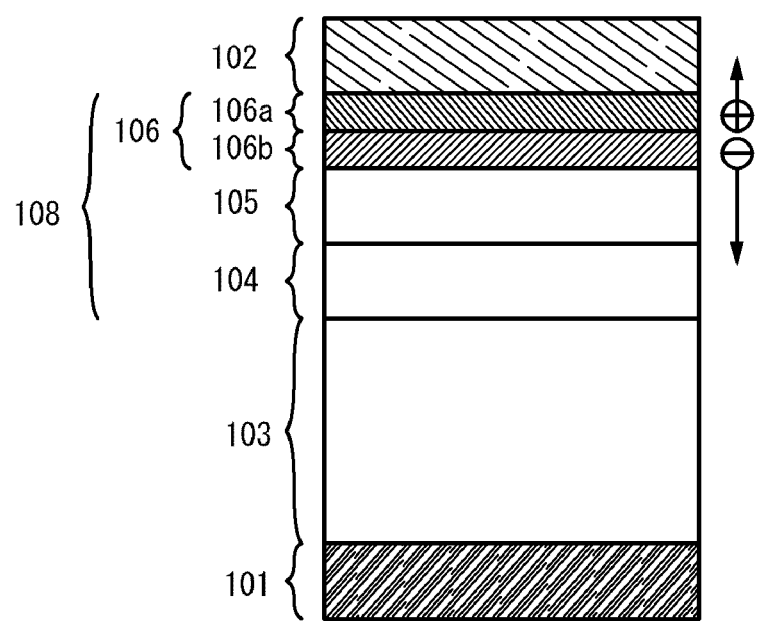

In element structures illustrated in FIGS. 4A and 4B, the EL layer 103 including a light-emitting region is disposed between the pair of electrodes (the anode 101 and the cathode 102), and between the cathode 102 and the EL layer 103, the charge generation region 106, the electron-relay layer 105, and the electron-injection buffer 104 are stacked sequentially from the cathode 102 side. In addition, the anode 101, the cathode 102, the EL layer 103, the electron-relay layer 105, and the electron-injection buffer 104 can be formed using the same materials as those described in Embodiment 1.

In the light-emitting elements illustrated in FIGS. 4A and 4B, the charge generation region 106 is a region that contains the substance having a high hole-transport property and the acceptor substance. Note that in the charge generation region 106, the acceptor substance attracts or accepts electrons from the substance having a high hole-transport property and accordingly holes and electrons are generated.

The charge generation region 106 illustrated in FIG. 4A has a structure in which one film contains the substance having a high hole-transport property and the acceptor substance. In that case, in the charge generation region 106, the acceptor substance is preferably added so that the weight ratio of the acceptor substance to the substance having a high hole-transport property is from 0.1:1 to 4.0:1 because carriers are easily generated in the condition.

In contrast, the charge generation region 106 illustrated in FIG. 4B has a stack structure of the layer 106a containing the substance having a high hole-transport property and the layer 106b containing the acceptor substance. Note that a charge transfer complex may be generated in the charge generation region 106. This charge transfer complex generated in the charge generation region 106 may absorb light in the visible region. When the layer 106a containing the substance having a high hole-transport property and the layer 106b containing the acceptor substance are stacked, the charge transfer complex is formed not in the whole charge generation region 106 but at the interface between the layer 106a and the layer 106b. In other words, the charge generation region 106 having a stack structure is preferred because such a structure makes it difficult for the charge transfer complex to adversely affect light emission of the light-emitting element.

As the substance having a high hole-transport property which is used for the charge generation region 106, any of a variety of organic compounds such as aromatic amine compounds, carbazole derivatives, aromatic hydrocarbons, or high molecular compounds (such as oligomers, dendrimers, or polymers) can be used. Specifically, a substance having a hole mobility of $10^{-6}$ cm$^2$/Vs or more is preferably used. However, substances other than the above described materials may also be used as long as the substances have higher hole-transport properties than electron-transport properties.

As specific examples of the aromatic amine compounds, the following can be given: 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA) 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), N,N'-bis(4-methylphenyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), and the like.

As specific examples of the carbazole derivatives, the following can be given: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Besides, the following can be given: 4,4'-di(N-carbazolyl)biphenyl (abbreviation: CBP), 1,3,5-tris[4-(N-carbazolylphenyl]benzene (abbreviation: TCPB), 9-[4-(N-carbazolyl)phenyl]-10-phenylanthracene (abbreviation: CzPA), 1,4-bis[4-(N-carbazolylphenyl]-2,3,5,6-tetraphenylbenzene, and the like.

As specific examples of the aromatic hydrocarbons, the following can be given: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4- phenylphenyl)anthracene (abbreviation: t-BuDBA), 9,10-di (2-naphthyl)anthracene (abbreviation: DNA); 9,10-diphenylanthracene (abbreviation: DPAnth), 2-tert-butylanthracene (abbreviation: t-BuAnth); 9,10-bis(4-methyl-1-naphthyl)anthracene (abbreviation: DMNA), 9,10-bis[2-(1-naphthyl)phenyl]-2-tert-butylanthracene, 9,10-bis [2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides those, pentacene, coronene, or the like can also be used. In particular, the aromatic hydrocarbon which has a hole mobility of $1 \times 10^{-6}$ cm$^2$/Vs or more and which has 14 to 42 carbon atoms is particularly preferable.

Further, the aromatic hydrocarbon may have a vinyl skeleton. As the aromatic hydrocarbon having a vinyl group, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like are given, for instance.

Alternatively, a high molecular compound such as poly(N-vinylcarbazole) (abbreviation: PVK) or poly(4-vinyltriphenylamine) (abbreviation: PVTPA) can be used.

As the acceptor substance used for the charge generation region 106, 7,7,8,8-tetracyano-2,3,5,6-tetrafluoroquinodimethane (abbreviation: F4-TCNQ), chloranil, and the like can be given. In addition, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high.

Note that the structure described in this embodiment can be used in appropriate combination with any structure described in Embodiments 1 to 3.

Embodiment 5

Figure 5A:
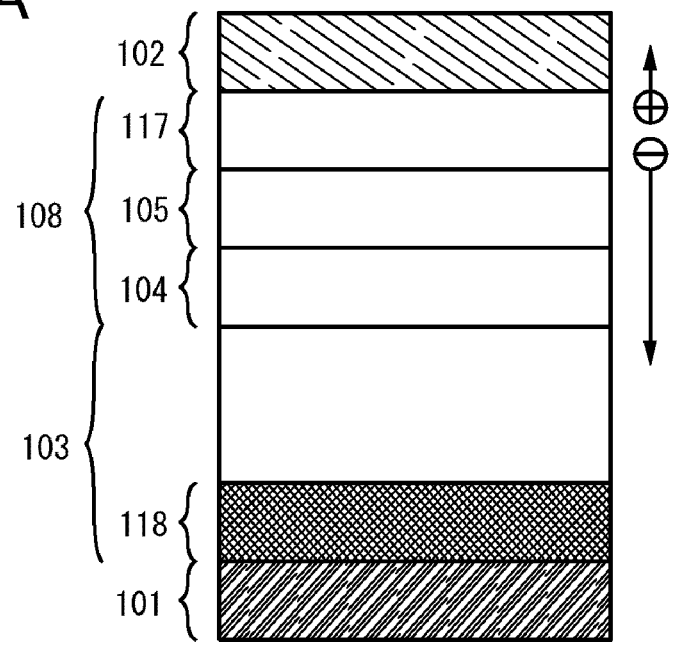
FIGS. 5A and 5B each illustrate an element structure of a light-emitting element.
Figure 5B:
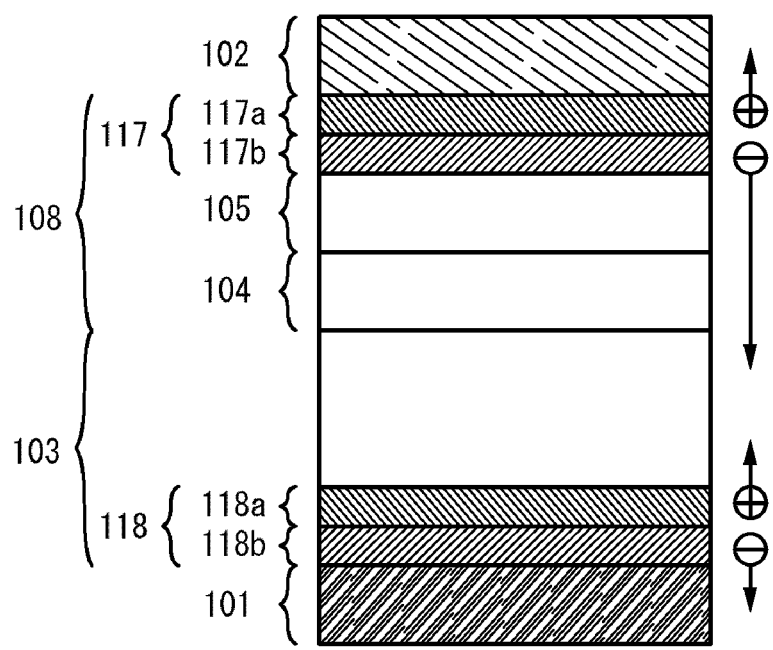

In this embodiment, using FIGS. 5A and 5B, a structure in which another charge generation region is formed in part of the EL layer 103 so as to be in contact with the anode 101 is described as an example of the light-emitting element included in the basic structure described in Embodiment 1. Thus, the light-emitting element described in this embodiment has the adjusting layer 108 and the EL layer 103 between the cathode and the anode. As detailed below in this embodiment, the charge generation region 106 which is part of the adjusting layer described in Embodiment 1 is denoted as a first charge generation region 117. In addition, the charge generation region which is part of the EL layer 103 and in contact with the anode 101 is denoted as a second charge generation region 118.

Further, as illustrated in FIG. 5A, each of the first charge generation region 117 and the second charge generation region 118 may have a single-layer structure containing a substance having a high hole-transport property and an acceptor substance. Alternatively, the following structure as illustrated in FIG. 5B may be employed: the first charge generation region 117 has a stack of a layer 117a containing the substance having a high hole-transport property and a layer 117b containing the acceptor substance, and the second charge generation region 118 has a stack of a layer 118a containing the substance having a high hole-transport property and a layer 118b containing the acceptor substance.

In FIGS. 5A and 5B, the EL layer 103 including a light-emitting region is disposed between the pair of electrodes (the anode 101 and the cathode 102), and the second charge generation region 118 which is formed in part of the EL layer 103 so as to be in contact with the anode 101 is provided. In addition, between the cathode 102 and the EL layer 103, the first charge generation region 117, the electron-relay layer 105, and the electron-injection buffer 104 are stacked from the cathode 102 side in this order. Note that the materials for the anode 101, the cathode 102, the EL layer 103, the electron-injection buffer 104, and the electron-relay layer 105 can be the same as those described in Embodiments 1 to 4. In addition, the first charge generation region 117 can be formed using the materials that can be used for the charge generation region 106 described in Embodiments 1 to 4.

In the light-emitting element illustrated in FIGS. 5A and 5B, the second charge generation region 118 is similar to the first charge generation region 117, and contains a substance having a high hole-transport property and an acceptor substance. Thus, in the second charge generation region 118, the acceptor substance attracts electrons from the substance having a high hole-transport property, whereby holes and electrons are generated.

The second charge generation region 118 illustrated in FIG. 5A has a structure in which one film contains the substance having a high hole-transport property and the acceptor substance. In this case, preferably, the acceptor substance is added so that the weight ratio of the acceptor substance to the substance having a high hole-transport property is from 0.1:1 to 4.0:1, whereby carrier generation in the second charge generation region 118 is facilitated. In addition, in FIG. 5A, by forming the first charge generation region 117 and the second charge generation region 118 using the same material, a stress on the anode 101 side and a stress on cathode 102 side of the light-emitting element can be even, which leads to a reduction in inside stress of the light-emitting element.

In contrast, the second charge generation region 118 illustrated in FIG. 5B has a stack structure of the layer 118a containing the substance having a high hole-transport property and the layer 118b containing the acceptor substance. Note that a charge transfer complex may be generated in the second charge generation region 118. The charge transfer complex generated in the second charge generation region 118 may absorb light in the visible region. When the layer 118a containing the substance having a high hole-transport property and the layer 118b containing the acceptor substance are stacked, the charge transfer complex is formed not in the whole second charge generation region 118 but at the interface between the layer 118a and the layer 118b. In other words, the second charge generation region 118 having a stack structure is preferred because such a structure makes it difficult for the charge transfer complex to adversely affect light emission of the light-emitting element. Note that, as illustrated in FIG. 5B, the first charge generation region 117 may also have a stack structure of the layer 117a containing the substance having a high hole-transport property and the layer 117b containing the acceptor substance.

Note that as the substance having a high hole-transport property used for formation of the second charge generation region 118, the substances described as the substance having a high hole-transport property used for the formation of the charge generation region 106 in Embodiment 4 can be used similarly. In addition, as the acceptor substance used for formation of the second charge generation region 118, the substances described as the acceptor substance used for the formation of the charge generation region 106 in Embodiment 4 can be used similarly.

Note that the structure described in this embodiment can be combined with any of the structures described in Embodiments 1 to 4 as appropriate.

Embodiment 6

In this embodiment, as examples of a light-emitting device which is manufactured with the use of the light-emitting element described in Embodiments 1 to 5, a passive matrix light-emitting device and an active matrix light-emitting device will be described.

FIGS. 6A to 6D and FIG. 7 illustrate examples of passive matrix light-emitting devices.

In a passive-matrix (also referred to as simple-matrix) light-emitting device, a plurality of anodes arranged in stripes (in stripe form) are provided to be perpendicular to a plurality of cathodes arranged in stripes. A light-emitting layer is interposed at each intersection. Therefore, a pixel at an intersection of an anode selected (to which a voltage is applied) and a cathode selected emits light.

Figure 6A:
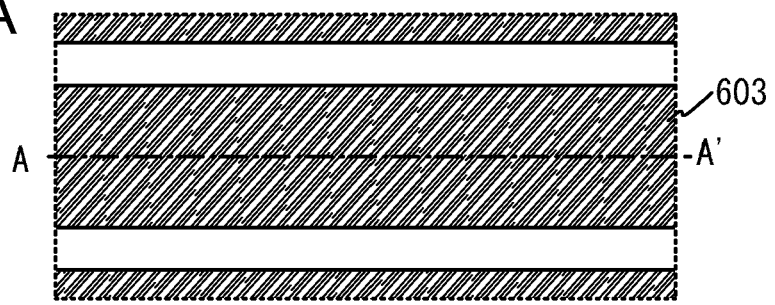
FIGS. 6A to 6D illustrate a passive-matrix light-emitting device.
Figure 6B:
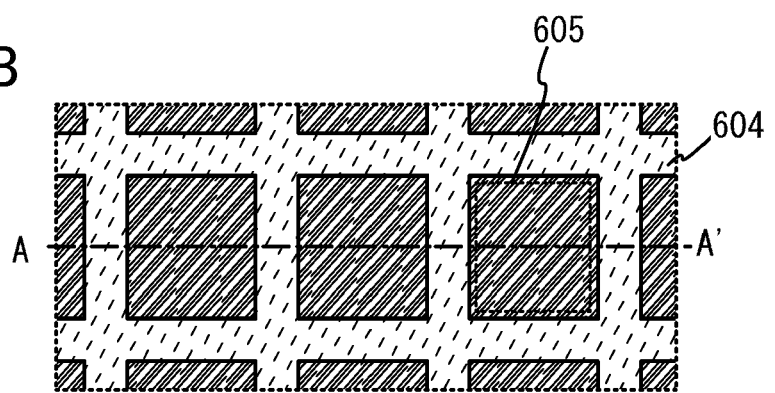
Figure 6C:
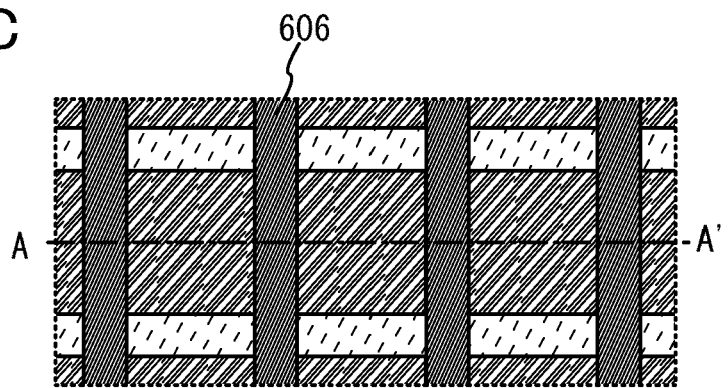
Figure 6D:
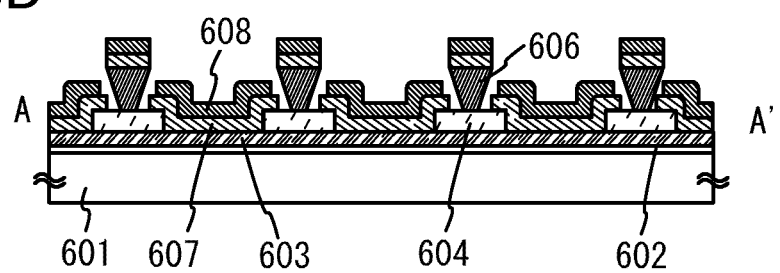

FIGS. 6A to 6C are top views of a pixel portion before sealing. FIG. 6D is a cross-sectional view taken along dashed line A-A' in each of FIGS. 6A to 6C.

Over a substrate 601, an insulating layer 602 is formed as a base insulating layer. Note that the base insulating layer is not necessarily formed. Over the insulating layer 602, a plurality of first electrodes 603 is arranged in stripes at regular intervals (see FIG. 6A).

A partition wall 604 having openings each corresponding to a pixel is provided over the first electrodes 603. The partition wall 604 having openings is formed using an insulating material (a photosensitive or nonphotosensitive organic material (polyimide, acrylic, polyamide, polyimide amide, resist, or benzocyclobutene) or an SOG film (such as a $SiO_x$ film containing an alkyl group)). Note that an opening 605 corresponding to each pixel acts as a light-emitting region (FIG. 6B).

Over the partition wall 604 that has openings, a plurality of mutually parallel reversely tapered partition walls 606 are provided to intersect with the first electrodes 603 (FIG. 6C). The reversely tapered partition walls 606 are formed by a photolithography method using a positive-type photosensitive resin by which a portion unexposed to light remains as a pattern, and the amount of light exposure or the length of development time is adjusted so that a lower portion of the pattern is etched more.

After the reversely tapered partition walls 606 are formed as illustrated in FIG. 6C, a layer 607 containing an organic compound and second electrodes 608 are sequentially formed as illustrated in FIG. 6D. Note that the layer 607 containing the organic compound which is described in this embodiment corresponds to the layer including the EL layer, the charge generation regions (including the first charge generation region and the second charge generation region), the electron-relay layer, and the electron-injection buffer, described as the layers formed between the anode and the cathode in Embodiments 1 to 5. The sum of the heights of the partition wall 604 having openings and the reversely tapered partition wall 606 exceeds the sum of the thicknesses of the layer 607 containing the organic compound and the second electrode 608. Therefore, as illustrated in FIG. 6D, the layers 607 containing the organic compound and the second electrodes 608 which are separated into a plurality of regions are formed. Note that the plurality of separated regions are electrically isolated from one another.

The second electrodes 608 are parallel to each other in stripes and extend in the direction in which they intersect with the first electrodes 603. Note that although parts of a layer for forming the layers 607 containing the organic compound and parts of a conductive layer for forming the second electrodes 608 are formed even over the reversely tapered partition walls 606, these parts are insulated from the layers 607 containing the organic compound and the second electrodes 608. Further, the layer containing an organic compound in this embodiment includes the charge generation regions (including the first charge generation region and the second charge generation region), the electron-relay layer, the electron-injection buffer, and the EL layer described in Embodiments 1 to 5, and the EL layer includes at least the light-emitting layer.

Note that the first electrode 603 may serve as an anode and the second electrode 608 may serve as a cathode, or vice versa. Further, the stack structure of the layers 607 containing the organic compound may be adjusted depending on the polarities of the electrodes as appropriate so as to have the structure as described in Embodiments 1 to 5.

In addition, a sealing member such as a sealing can or a glass substrate may be attached to the substrate 601 with adhesive such as a sealant so that the light-emitting element may be placed in a sealed space, if necessary. In this manner, the light-emitting element can be prevented from deteriorating. The sealed space may be filled with filler or a dry inert gas. In addition, a desiccant or the like may be put between the substrate and the sealing member so that deterioration of the light-emitting element due to moisture or the like can be prevented. The desiccant removes a minute amount of moisture, thereby achieving sufficient desiccation. The desiccant can be a substance which absorbs moisture by chemical adsorption such as an oxide of an alkaline earth metal typified by calcium oxide or barium oxide. Note that a substance which adsorbs moisture by physical adsorption such as zeolite or silica gel may be used as well.

Figure 7:
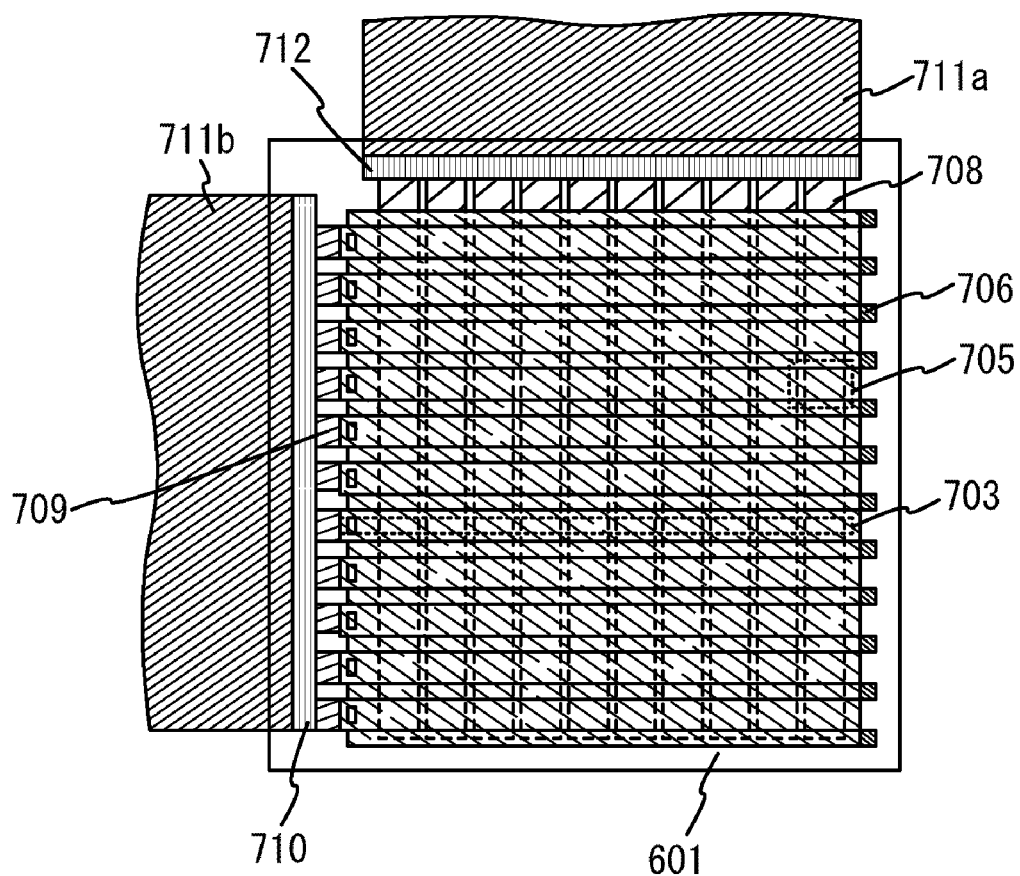
FIG. 7 illustrates a passive matrix light-emitting device.

FIG. 7 is a top view of the case where the passive-matrix light-emitting device illustrated in FIGS. 6A to 6D is provided with an FPC or the like.

As illustrated in FIG. 7, in a pixel portion forming an image display, scanning lines and data lines intersect with each other so that they are orthogonal to each other.

The first electrodes 603 in FIGS. 6A to 6D correspond to scan lines 703 in FIG. 7; the second electrodes 608 in FIGS. 6A to 6D correspond to data lines 708 in FIG. 7; and the reversely tapered partition walls 606 correspond to partition walls 706. The layers 707 containing the organic compound illustrated in FIG. 6D are interposed between the data lines 708 and the scanning lines 703, and an intersection indicated by a region 705 corresponds to one pixel.

Note that the scanning lines 703 are electrically connected at their ends to connection wirings 709, and the connection wirings 709 are connected to an FPC 711b via an input terminal 710. The data lines are connected to an FPC 711a via an input terminal 712.

If necessary, a polarizing plate, a circularly polarizing plate (including an elliptically polarizing plate), a retardation plate (a quarter-wave plate or a half-wave plate), or an optical film such as a color filter may be appropriately provided over a light-emitting surface. Further, the polarizing plate or the circularly polarizing plate may be provided with an anti-reflection film. For example, anti-glare treatment may be carried out by which reflected light can be diffused by projections and depressions on the surface so as to reduce the reflection.

Although FIG. 7 illustrates the example in which a driver circuit is not provided over a substrate, an IC chip including a driver circuit may be mounted on the substrate.

When the IC chip is mounted, a data line side IC and a scanning line side IC, in each of which the driver circuit for transmitting a signal to a pixel portion is formed, are mounted on the periphery of (outside) the pixel portion by a COG method. The mounting may be performed using TCP or a wire bonding method other than the COG method. TCP is TAB tape mounted with an IC, and the TAB tape is connected to a wiring over the substrate and the IC is mounted. Each of the data line side IC and the scanning line side IC may be formed using a silicon substrate or may be formed by formation of a driver circuit using a TFT over a glass substrate, a quartz substrate, or a plastic substrate.

Figure 8A:
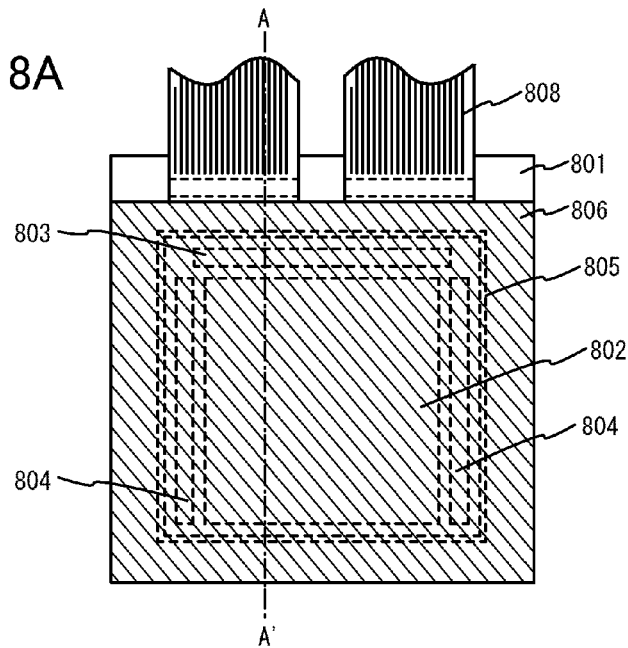
FIGS. 8A and 8B illustrate an active matrix light-emitting device.
Figure 8B:
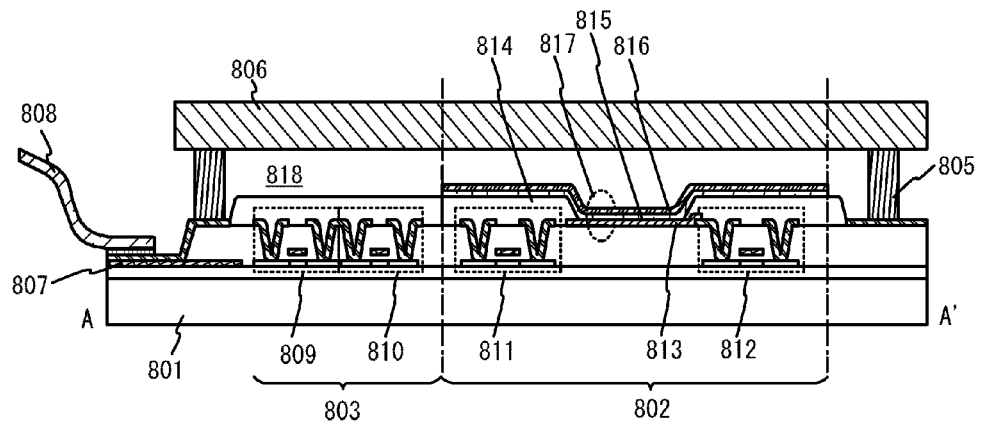

Next, an example of an active-matrix light-emitting device is described with reference to FIGS. 8A and 8B. Note that FIG. 8A is a top view illustrating a light-emitting device and FIG. 8B is a cross-sectional view taken along chain line A-A' in FIG. 8A. The active-matrix light-emitting device of this embodiment includes, over an element substrate 801, a pixel portion 802, a driver circuit portion (a source side driver circuit) 803, and a driver circuit portion (a gate side driver circuit) 804. The pixel portion 802, the driver circuit portion 803, and the driver circuit portion 804 are sealed with a sealant 805 between the element substrate 801 and a sealing substrate 806.

In addition, over the element substrate 801, a lead wiring 807 for connecting an external input terminal, through which a signal (e.g., a video signal, a clock signal, a start signal, a reset signal, or the like) and electric potential from the outside are transmitted to the driver circuit portion 803 and the driver circuit portion 804, is provided. Here, an example is described in which a flexible printed circuit (FPC) 808 is provided as the external input terminal Although only the FPC is illustrated here, this FPC may have a printed wiring board (PWB) attached. The light-emitting device in this specification includes not only a light-emitting device itself but also a state in which an FPC or a PWB is attached thereto.

Next, a cross-sectional structure will be described with reference to FIG. 8B. Although the driver circuit portions and the pixel portion are formed over the element substrate 801, here, the pixel portion 802 and the driver circuit portion 803 which is the source side driver circuit are illustrated.

An example is illustrated in which a CMOS circuit which is a combination of an n-channel TFT 809 and a p-channel TFT 810 is formed as the driver circuit portion 803. Note that a circuit included in the driver circuit portion may be formed using various CMOS circuits, PMOS circuits, or NMOS circuits. Although a driver integrated type in which the driver circuit is formed over the substrate is described in this embodiment, the driver circuit is not necessarily formed over the substrate, and the driver circuit can be formed outside, not over the substrate.

Further, the pixel portion 802 has a plurality of pixels, each including a switching TFT 811, a current control TFT 812, and an anode 813 electrically connected to a wiring (a source electrode or a drain electrode) of the current control TFT 812. An insulator 814 is formed so as to cover an edge portion of the anode 813. In this embodiment, the insulator 814 is formed using a positive photosensitive acrylic resin.

In addition, in order to obtain favorable coverage by a film which is to be stacked over the insulator 814, the insulator 814 is preferably formed so as to have a curved surface with curvature at an upper edge portion or a lower edge portion. For example, the insulator 814 is preferably formed using a positive photosensitive acrylic resin to have a curved surface with a curvature radius (0.2 μm to 3 μm) at the upper edge portion. Either a negative photosensitive material which becomes insoluble in an etchant by light or a positive photosensitive material which becomes soluble in an etchant by light can be used for the insulator 814. As the insulator 814, without limitation to an organic compound, an inorganic compound such as silicon oxide or silicon oxynitride can be used.

A layer 815 containing an organic compound and a cathode 816 are stacked over the anode 813. Note that when an ITO film is used as the anode 813, and a stacked film of a titanium nitride film and a film containing aluminum as its main component or a stacked film of a titanium nitride film, a film containing aluminum as its main component, and a titanium nitride film is used as a wiring of the current control TFT 812 which is connected to the anode 813, favorable ohmic contact with the ITO film can be formed, and resistance of the wiring can be made low. Note that, although not illustrated, the cathode 816 is electrically connected to the FPC 808 which is an external input terminal.

Note that the layer 815 containing the organic compound described in this embodiment is a layer including the EL layer, the charge generation regions (including the first charge generation region and the second charge generation region), the electron-relay layer, and the electron-injection buffer, which is described as the layers provided between the anode and the cathode in Embodiments 1 to 5. Further, in the EL layer, at least the light-emitting layer is provided and a hole-injection layer, a hole-transport layer, an electron-transport layer, and an electron-injection layer may further be provided as appropriate. The light-emitting element 817 has a stack structure of the anode 813, the layer 815 containing the organic compound, and the cathode 816.

In addition, although the cross-sectional view of FIG. 8B illustrates only one light-emitting element 817, a plurality of light-emitting elements are arranged in matrix in the pixel portion 802. Note that when color display of color components of R (red), G (green) and B (blue) is performed, plural light-emitting elements for emission colors of three colors (R, G, B) are formed in the pixel portion 802. In addition, the number of color components is not limited to three, and four or more colors may be used or another color than RGB may be used. For example, RGBW (W means white) display may be used by addition of white.

As methods for fabricating light-emitting elements having different color components, there are a method in which an EL layer for each color is separately formed, a method in which EL layers all of which are formed so as to exhibit white emission are combined with color filters thereby forming light-emitting elements having different color components, and a method in which EL layers all of which are formed so as to exhibit blue emission or emission with a wavelength shorter than blue and combined with color conversion layers thereby forming light-emitting elements having different color components, and the like.

By attachment of the sealing substrate 806 to the element substrate 801 with the sealant 805, a structure in which the light-emitting element 817 is provided in a space 818 surrounded by the element substrate 801, the sealing substrate 806, and the sealant 805 is formed. Note that the space 818 may be filled with an inert gas (such as nitrogen and argon) or the sealant 805.

It is preferable to use an epoxy-based resin for the sealant 805. In addition, preferably, the material does not transmit moisture or oxygen as much as possible. As the sealing substrate 806, a plastic substrate formed of fiberglass-reinforced plastics (FRP), polyvinyl fluoride (PVF), polyester, acrylic, or the like can be used besides a glass substrate or a quartz substrate.

As described above, an active-matrix light-emitting device can be provided.

Note that the structure described in this embodiment can be used in appropriate combination with any structure described in Embodiments 1 to 5.

Embodiment 7

In this embodiment, with reference to FIGS. 9A to 9E, description is given of a variety of electronic devices and lighting devices that are completed by using any light-emitting device manufactured by applying the present invention.

Examples of the electronic devices to which the light-emitting device according to the present invention is applied include television sets (also referred to as televisions or television receivers), monitors of computers or the like, cameras such as digital cameras or digital video cameras, digital photo frames, cellular phones (also referred to as cellular phone sets), portable game consoles, portable information terminals, audio reproducing devices, large-sized game machines such as pachinko machines, and the like. Some specific examples of these electronic devices and lighting devices are illustrated in FIGS. 9A to 9E.

FIG. 9A illustrates an example of a television set 9100. In the television set 9100, a display portion 9103 is incorporated in a housing 9101. Images can be displayed by the display portion 9103, to which the light-emitting device manufactured by the present invention can be applied. Here, the housing 9101 is supported by a stand 9105.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

Note that the television set 9100 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Note that power consumption of the light-emitting device to which the present invention is applied is reduced. Thus, use of the light-emitting device for the display portion 9103 of the television set enables provision of the low power consumption television set.

FIG. 9B illustrates a computer, which includes a main body 9201, a housing 9202, a display portion 9203, a keyboard 9204, an external connecting port 9205, a pointing device 9206, and the like. Note that the computer is manufactured by using the light-emitting device provided according to the present invention for the display portion 9203.

Note that power consumption of the light-emitting device to which the present invention is applied is reduced. Thus, use of the light-emitting device for the display portion 9203 of the computer enables provision of the low power consumption computer.

FIG. 9C illustrates a portable amusement machine as an example of an electronic device which includes two housings: a housing 9301 and a housing 9302. The housings 9301 and 9302 are connected with a connection portion 9303 so as to be opened and closed. A display portion 9304 and a display portion 9305 are incorporated in the housing 9301 and the housing 9302, respectively. In addition, the portable amusement machine illustrated in FIG. 9C includes a speaker portion 9306, a recording medium insertion portion 9307, an LED lamp 9308, an input means (an operation key 9309, a connection terminal 9310, a sensor 9311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9312), and the like. It is needless to say that the structure of the portable amusement machine is not limited to the above as long as the light-emitting device manufactured by the present invention is used for at least either the display portion 9304 or the display portion 9305, or both, and may be provided with an additional accessory as appropriate. The portable amusement machine illustrated in FIG. 9C has a function of reading a program or data stored in a recording medium to display it on the display portion, and a function of sharing information with another portable amusement machine by wireless communication. The portable amusement machine illustrated in FIG. 9C can have any other various functions without limitation to the above.

Note that power consumption of the light-emitting device to which the present invention is applied is reduced. Thus, use of the light-emitting device for the display portions 9304 and/or 9305 of the portable amusement machine enables provision of the low power consumption amusement machine.

FIG. 9D illustrates a cellular phone. A cellular phone 9400 is provided with a display portion 9402 incorporated in a housing 9401, operation buttons 9403, an external connection port 9404, a speaker 9405, a microphone 9406, and the like. Note that the cellular phone 9400 is fabricated by using the light-emitting device provided according to the present invention for the display portion 9402.

When the display portion 9402 of the cellular phone 9400 illustrated in FIG. 9D is touched with a finger or the like, data can be input into the cellular phone 9400. Furthermore, operations such as making calls and composing mails can be performed by touching the display portion 9402 with a finger or the like.

There are mainly three screen modes for the display portion 9402. The first mode is a display mode mainly for displaying images. The second mode is an input mode mainly for inputting data such as text. The third mode is a display-and-input mode in which two modes of the display mode and the input mode are combined.

For example, for operations of making calls and composing mails, the display portion 9402 is set to a text input mode mainly for inputting text so that text displayed on the screen can be input. In this case, a keyboard or number buttons are preferably displayed on almost the entire screen of the display portion 9402.

By providing a detection device which includes a sensor for detecting inclination, such as a gyroscope or an acceleration sensor, inside the cellular phone 9400, the direction of the cellular phone 9400 (whether the cellular phone 9400 is placed horizontally or vertically) is determined so that display on the screen of the display portion 9402 can be automatically switched.

In addition, the screen mode is switched by touching the display portion 9402 or operating the operation buttons 9403 of the housing 9401. Alternatively, the screen mode can be switched depending on the kind of images displayed on the display portion 9402. For example, when a signal of an image displayed on the display portion is of moving image data, the screen mode is switched to the display mode. When the signal is of text data, the screen mode is switched to the input mode.

Furthermore, in the input mode, when input by touching the display portion 9402 is not performed for a specified period while a signal detected by the optical sensor in the display portion 9402 is detected, the screen mode may be controlled so as to be switched from the input mode to the display mode.

The display portion 9402 can function as an image sensor. For example, an image of a palm print, a fingerprint, or the like is taken by touching the display portion 9402 with the palm or the finger, whereby personal authentication can be performed. Furthermore, by providing a backlight or a sensing light source emitting a near-infrared light for the display portion, an image of a finger vein, a palm vein, or the like can also be taken.

Note that power consumption of the light-emitting device to which the present invention is applied is reduced. Thus, use of the light-emitting device for the display portion 9402 of the cellular phone 9400 enables provision of the low power consumption cellular phone.

FIG. 9E illustrates a lighting device (a desk lamp) including a lighting portion 9501, a shade 9502, an adjustable arm 9503, a support 9504, a base 9505, and a power supply switch 9506. Note that the lighting device is manufactured using a light-emitting device according to the present invention for the lighting portion 9501. Note that the term "lighting device" also encompasses ceiling lights (ceiling-fixed lighting devices), wall lights (wall-hanging lighting devices), and the like, as well as the desk lamp illustrated in FIG. 9E.

Note that power consumption of the light-emitting device to which the present invention is applied is reduced. Thus, use of the light-emitting device for the display portion 9501 of the lighting device (desk lamp) enables provision of the low power consumption lighting device.

Figure 10:
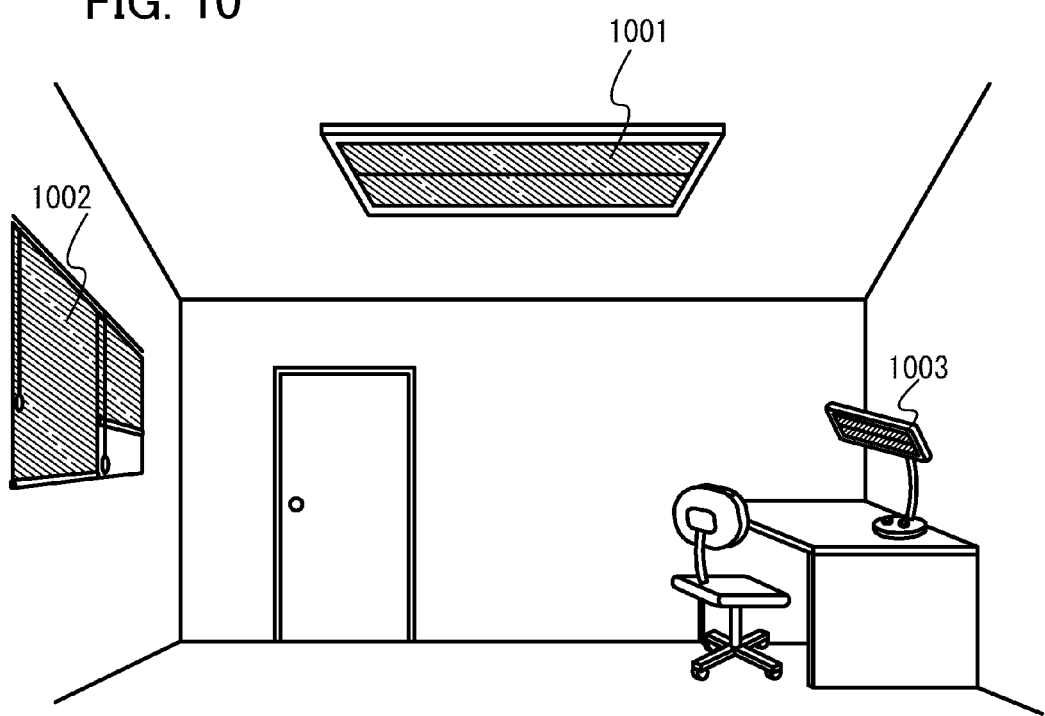
FIG. 10 illustrates lighting devices.

FIG. 10 illustrates an example in which light-emitting devices to each of which the present invention is applied are used as interior lighting devices. Since the light-emitting device of the present invention can also have a larger area, it can be used as a lighting device having a large area as illustrated by a ceiling light 1001. Additionally, the light-emitting device can be used as a wall light 1002. Since the light-emitting device formed according to the present invention has the light-emitting element with low drive voltage, it can be used as the lighting device with low power consumption. As illustrated in FIG. 10, a desk lamp 1003 illustrated in FIG. 9E may be used together in the room provided with the interior lighting devices.

As described above, an electronic device or a lighting device can be obtained by applying the light-emitting device according to the present invention. The application range of the light-emitting device according to the present invention is wide so that the light-emitting device can be applied to electronic devices and lighting devices in a variety of fields.

Note that the structure described in this embodiment can be combined with any of the structures described in Embodiments 1 to 6 as appropriate.

EXAMPLE 1

In this example, a light-emitting element which is an example of the present invention is described. Structural Formulas of materials used in this example are illustrated below.

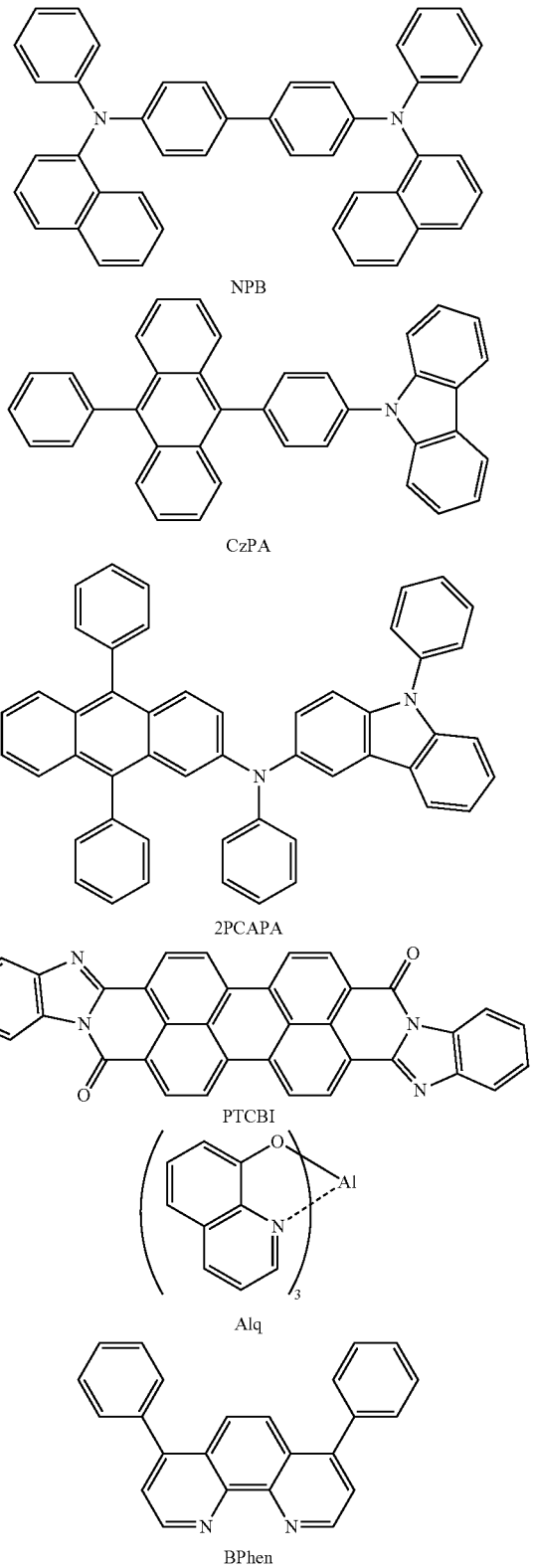

[Chemical Formula 1]

NPB

CzPA

2PCAPA

PTCBI

Alq

BPhen (Fabrication of Light-Emitting Element A)

First, indium oxide-tin oxide containing silicon oxide (abbreviation: ITSO) was deposited to a thickness of 110 nm over a glass substrate by a sputtering method to form an anode (an electrode area: 2 mm×2 mm).

Next, the glass substrate provided with the anode was fixed to a substrate holder provided in a film-formation chamber of a vacuum evaporation apparatus such that the side on which the anode was formed faced downward. The pressure in the film-formation chamber was reduced to about $10^{-4}$ Pa, and then a first charge generation region was formed by co-evaporation of 4,4'-bis[N-(1-naphthyl)-N-phenylamino]biphenyl (abbreviation: NPB), which is the substance having a high hole-transport property, and molybdenum(VI) oxide, which is the acceptor substance. The thickness of the first charge generation region was 50 nm, and the weight ratio of NPB to molybdenum(VI) oxide was set to 4:1 (=NPB:molybdenum oxide). Note that the co-evaporation method means an evaporation method in which evaporation is carried out using a plurality of evaporation sources in one treatment chamber simultaneously.

Next, NPB was deposited to a thickness of 10 nm by an evaporation method using resistance heating to form a hole-transport layer.

Next, 9-[4-(N-carbazolyl)phenyl]-10-phenylanthracene (abbreviation: CzPA) and 9,10-diphenyl-2-[N-phenyl-N-(9-phenyl-9H-carbazol-3-yl)amino]anthracene (abbreviation: 2PCAPA) were co-evaporated so that CzPA:2PCAPA=1:0.05, whereby a light-emitting layer was formed. CzPA is an electron-transport substance, and 2PCAPA is a substance which emits green light. The thickness of the light-emitting layer was 30 nm.

Then, by an evaporation method using resistance heating, tris(8-quinolinolato)aluminum (abbreviation: Alq) was deposited to a thickness of 10 nm and then bathophenanthroline (abbreviation: BPhen) was deposited to a thickness of 10 nm to form an electron-transport layer.

Next, a lithium oxide ($Li_2O$) film was formed to a thickness of approximately 0.1 nm by an evaporation method with resistance heating to form an electron-injection buffer.

Next, bisbenzimidazo[2,1-a:2',1'-a]anthra[2,1,9-def:6,5,10-d'e'f']diisoquinoline-10,21-dione) (abbreviation: PTCBI) and lithium (Li) were co-evaporated so that PTCBI:Li=1:0.02, whereby an electron-relay layer was formed. The thickness thereof was about 3 nm.

Then, 4,4'-bis[N-(1-naphthyl)-N-phenylamino]biphenyl (abbreviation: NPB), which is the substance having a high hole-transport property, and molybdenum(VI) oxide, which was the acceptor substance, were co-evaporated to form a second charge generation region. The thickness thereof was 20 nm, and the weight ratio between NPB and molybdenum (VI) oxide was set to 4:1 (=NPB:molybdenum oxide).

Next, a 200-nm-thick aluminum film was deposited to form a cathode. Thus, Light-emitting Element A was fabricated.

(Fabrication of Reference Light-Emitting Element a-1)

In fabrication of Reference Light-emitting Element a-1, formation of the anode over the glass substrate to formation of the electron-injection buffer were the same as those in Light-emitting Element A. The electron-relay layer and the second charge generation region were not formed, and the cathode was formed in the same manner as that of Light-emitting Element A. Thus, Reference Light-emitting Element a-1 was fabricated.

(Fabrication of Reference Light-Emitting Element a-2)

In fabrication of Reference Light-emitting Element a-2, formation of the anode over the glass substrate to formation of the electron-injection buffer were the same as those of Light-emitting Element A. The electron-relay layer was not formed, and the second charge generation region and the cathode were formed in the same manner as those of Light-emitting Element A. Thus, Reference Light-emitting Element a-2 was fabricated.

Table 1 below shows part of the element structures of Light-emitting Element A, Reference Light-emitting Element a-1, and Reference Light-emitting Element a-2. Note that the first charge generation region, the hole-transport layer, the light-emitting layer, and the electron-transport layer are omitted here, since the structures of these components are common between all the elements.

TABLE 1

| | anode | * | electron-injection buffer | electron-relay layer | second charge generation region | cathode |
|---|---|---|---|---|---|---|
| Light-emitting Element A | ITSO (110 nm) | ** | $Li_2O$ (0.1 nm) | PCTCBI:Li (3 nm, 1:0.02) | NPB:MoOx (20 nm 4:1) | Al (200 nm) |
| Reference Light-emitting Element a-1 | | | | — | — | |
| Reference Light-emitting Element a-2 | | | | — | NPB:MoOx (20 nm 4:1) | |

\* The citation of the first charge generation region, the hole-transport layer, the light-emitting layer, and the electron-transport layer are omitted here.
\*\* The citation of materials and thicknesses are omitted here.

Thus formed Light-emitting Element A, Reference Light-emitting Element a-1, and Reference Light-emitting Element a-2 were sealed in a glove box under a nitrogen atmosphere so that they were not exposed to atmospheric air. Then, the operating characteristics of the light-emitting elements were measured. Note that the measurement was carried out at room temperature (in an atmosphere kept at 25° C.).

Figure 11:
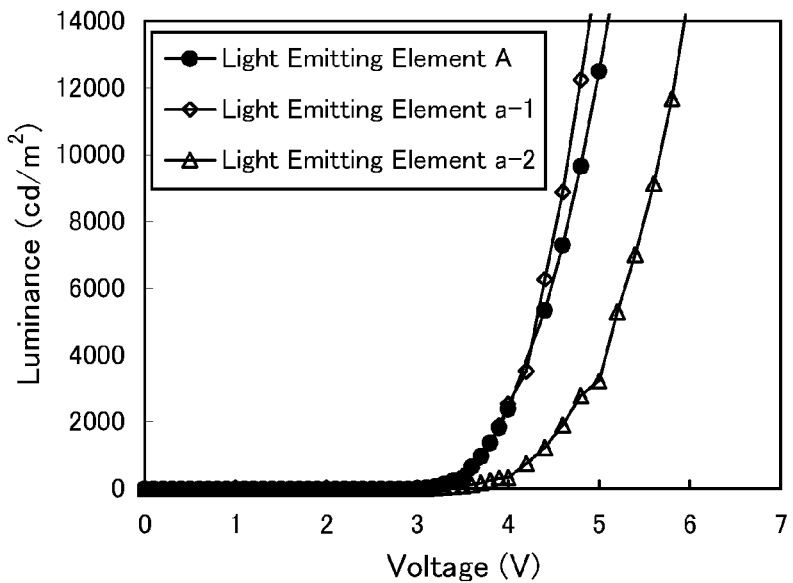
FIG. 11 is a graph showing characteristics of light-emitting elements of Example 1.
Figure 12:
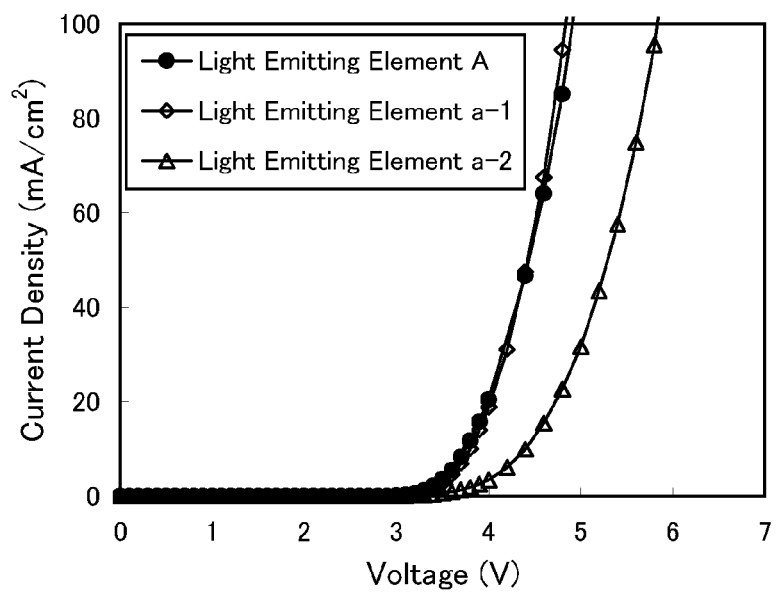
FIG. 12 is a graph showing characteristics of the light-emitting elements of Example 1.

FIG. 11 and FIG. 12 respectively show voltage-luminance characteristics and voltage-current density characteristics of Light-emitting Element A, Reference Light-emitting Element a-1, and Reference Light-emitting Element a-2. Table 2 shows initial values of main characteristics of the light-emitting elements at 1000 cd/m².

TABLE 2

|  | Voltage (V) | Chromaticity (x, y) | Current Efficiency (cd/A) | External Quantum Efficiency (%) |
|---|---|---|---|---|
| Light-emitting Element A | 3.7 | (0.28, 0.60) | 12 | 3.6 |
| Reference Light-emitting Element a-1 | 3.7 | (0.27, 0.60) | 14 | 3.8 |
| Reference Light-emitting Element a-2 | 4.4 | (0.29, 0.60) | 12 | 4.4 |

As apparent from FIG. 11, Light-emitting Element A has substantially the same luminance with respect to the same voltage as Reference Light-emitting Element a-1, in spite of the fact that Light-emitting Element A is different in element structure from Reference Light-emitting Element a-1 and has an increased thickness of total layers between electrodes. In addition, comparison of Light-emitting Element A with Reference Light-emitting Element a-2 reveals that the provision of the electron-relay layer realizes a high luminance with respect to the same voltage. Note that each light-emitting element exhibits green emission at a wavelength of around 520 nm from 2PCAPA, which is the light-emitting substance.

As for the voltage-current density characteristics shown in FIG. 12, it is apparent that Light-emitting Element A has substantially the same current density as Reference Light-emitting Element a-1. Additionally, current efficiencies of Light-emitting Element A, Reference Light-emitting Element a-1, and Reference Light-emitting Element a-2 are substantially the same at 1000 cd/m².

The above-described results demonstrate that, even when the thickness of the layer containing an organic compound provided between the electrodes of the light-emitting element is changed, a drive voltage increase can be suppressed.

EXAMPLE 2

In this example, a light-emitting element which is an example of the present invention is described. Structural Formulas of materials used in this example are illustrated below. However, Structural Formulas of the materials used in Example 1 are not illustrated here and can be found in Example 1.

[Chemical Formula 2]

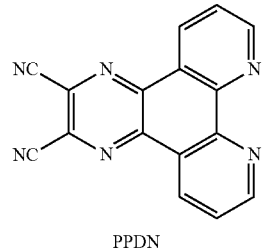

PPDN (Fabrication of Light-Emitting Element B)

The materials and formation methods of the anode, the first charge generation region, the hole-transport layer, the light-emitting layer, the electron-transport layer, and the electron-injection buffer were the same as those of Light-emitting Element A described in Example 1. The electron-relay layer was formed by co-evaporation of pirazino[2,3-f][1,10]phenanthroline-2,3-dicarbonitrile (abbreviation: PPDN) and lithium (Li) so that PPDN:Li=1:0.02. The thickness of the electron-relay layer was about 3 nm.

Then, the second charge generation region and the cathode were sequentially formed in the same manner as those of Light-emitting Element A described in Example 1, whereby Light-emitting Element B was fabricated.

(Fabrication of Reference Light-Emitting Element b-1)

In fabrication of Reference Light-emitting Element b-1, steps up to and including the formation of the electron-injection buffer were the same as those of Light-emitting Element B. The electron-relay layer was not formed, and the second charge generation region and the cathode were formed in the same manner as those of Light-emitting Element B. Thus, Reference Light-emitting Element b-1 was fabricated.

Table 3 below shows part of the element structures of Light-emitting Element B and Reference Light-emitting Element b-1. Note that the first charge generation region, the hole-transport layer, the light-emitting layer, and the electron-transport layer are omitted here, since the structures of these components are common between the two elements.

TABLE 3

|  | anode | * | electron-injection buffer | electron-relay layer | second charge generation region | cathode |
|---|---|---|---|---|---|---|
| Light-emitting Element B | ITSO (110 nm) | ** | Li₂O (0.1 nm) | PCTCBI:Li (3 nm, 1:0.02) | NPB:MoOx (20 nm 4:1) | Al (200 nm) |
| Reference Light-emitting Element b-1 |  |  |  | — |  |  |

\* The citation of the first charge generation region, the hole-transport layer, the light-emitting layer, and the electron-transport layer are omitted here.
\*\* The citation of materials and thicknesses are omitted here.

Thus formed Light-emitting Element B and Reference Light-emitting Element b-1 were sealed in a glove box under a nitrogen atmosphere so that they were not exposed to atmospheric air. Then, the operating characteristics of the light-emitting elements were measured. Note that the measurement was carried out at room temperature (in an atmosphere kept at 25° C.).

Figure 13:
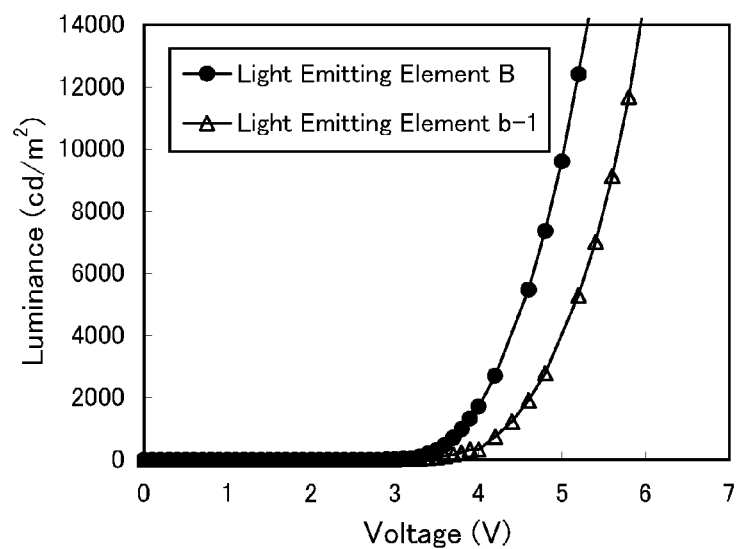
FIG. 13 is a graph showing characteristics of light-emitting elements of Example 2.
Figure 14:
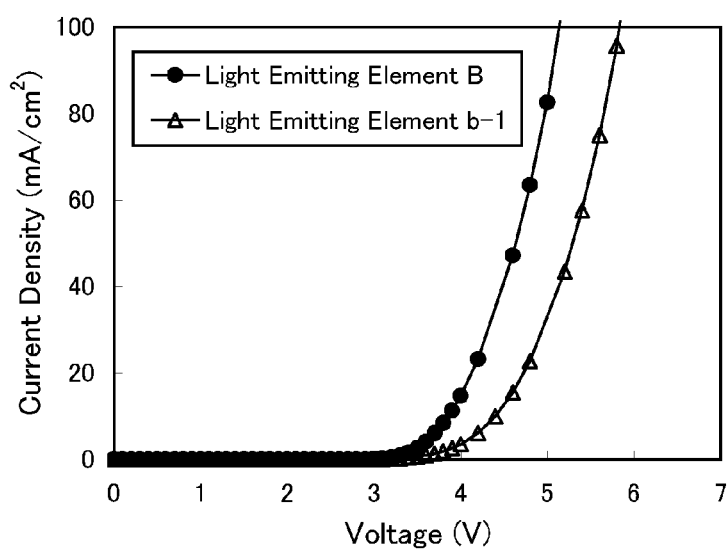
FIG. 14 is a graph showing characteristics of the light-emitting elements of Example 2.

FIG. 13 and FIG. 14 respectively show voltage-luminance characteristics and voltage-current density characteristics of Light-emitting Element B and Reference Light-emitting Element b-1. Table 4 shows initial values of main characteristics of the light-emitting elements at around 1000 cd/m².

TABLE 4

| | Voltage (V) | Chromaticity (x, y) | Current Efficiency (cd/A) | External Quantum Efficiency (%) |
|---|---|---|---|---|
| Light-emitting Element B | 3.8 | (0.29, 0.60) | 12 | 3.8 |
| Reference Light-emitting Element b-1 | 4.4 | (0.28, 0.62) | 14 | 4 |

As apparent from FIG. 13, Light-emitting Element B shows higher luminance than Reference Light-emitting Element b-1 with respect to the same voltage in spite of the fact that Light-emitting Element B is different in element structure from Reference Light-emitting Element b-1 and has an increased thickness of total layers between electrodes. Note that each light-emitting element exhibits green emission at a wavelength of around 520 nm from 2PCAPA, which is the light-emitting substance.

As for the voltage-current density characteristics shown in FIG. 14, it is apparent that Light-emitting Element B shows higher current density than Reference Light-emitting Element b-1. Additionally, current efficiencies of Light-emitting Element B and Reference Light-emitting Element b-1 are substantially the same at 1000 cd/m$^2$.

The above-described results demonstrate that, even when the thickness of the layer containing an organic compound provided between the electrodes of the light-emitting element is changed, a drive voltage increase can be suppressed.

This application is based on Japanese Patent Application serial No. 2009-131017 filed with Japan Patent Office on May 29, 2009, the entire contents of which are hereby incorporated by reference.

What is claimed is:

1. A light-emitting element comprising:
   an EL layer between an anode and a cathode;
   a first layer including a substance having a hole-transport property and an acceptor substance being in contact with the cathode and between the cathode and the EL layer;
   a second layer including a first donor substance and a first substance having an electron-transport property and being in contact with the first layer and between the cathode and the EL layer; and
   a third layer including a second donor substance and a second substance having an electron-transport property and being in contact with the second layer and with the EL layer and between the cathode and the EL layer,
   wherein a LUMO level of the first substance having an electron-transport property is lower than a LUMO level of the second substance having an electron-transport property.

2. The light-emitting element according to claim 1, wherein the substance having a hole-transport property is an aromatic amine compound, a carbazole derivative, an aromatic hydrocarbon, or a high molecular compound.

3. The light-emitting element according to claim 1, wherein the substance having a hole-transport property is a substance having a hole mobility of $10^{-6}$ cm$^2$/Vs or more.

4. The light-emitting element according to claim 1, wherein the substance having a hole-transport property has a higher hole-transport property than an electron-transport property.

5. The light-emitting element according to claim 1, wherein the acceptor substance is a transition metal oxide or an oxide of a metal belonging to Group 4 to Group 8 of the periodic table.

6. The light-emitting element according to claim 1, wherein the acceptor substance is molybdenum oxide.

7. The light-emitting element according to claim 1, wherein the first donor substance is an alkali metal, an alkaline earth metal, a rare earth metal, an alkali metal compound, an alkaline earth metal compound, or a rare earth metal compound.

8. The light-emitting element according to claim 1, wherein the second donor substance is an alkali metal, an alkaline earth metal, a rare earth metal, an alkali metal compound, an alkaline earth metal compound, or a rare earth metal compound.

9. The light-emitting element according to claim 1, wherein the EL layer comprises a fourth layer having an electron-transport property, and
   wherein the fourth layer is in contact with the third layer.

10. The light-emitting element according to claim 1, wherein the acceptor substance is added so that a weight ratio of the acceptor substance to the substance having a hole-transport property is greater than or equal to 0.1:1 and less than or equal to 4.0:1 in the first layer.

11. The light-emitting element according to claim 1, wherein the first layer has a stack structure of a layer including the substance having a hole-transport property and a layer including the acceptor substance.

12. The light-emitting element according to claim 1, wherein the first donor substance is added so that a weight ratio of the first donor substance to the first substance having an electron-transport property is greater than or equal to 0.001:1 and less than or equal to 0.1:1 in the second layer.

13. The light-emitting element according to claim 1, wherein the LUMO level of the first substance having an electron-transport property included in the second layer is greater than or equal to −5.0 eV.

14. The light-emitting element according to claim 1, wherein the second donor substance is added so that a weight ratio of the second donor substance to the second substance having an electron-transport property is greater than or equal to 0.001:1 and less than or equal to 0.1:1 in the third layer.

15. The light-emitting element according to claim 1, wherein the EL layer comprises a fifth layer including a third substance having a hole-transport property and a second acceptor substance, and
   wherein the fifth layer is in contact with the anode.

16. The light-emitting element according to claim 15, wherein the second substance having a hole-transport property is an aromatic amine compound, a carbazole derivative, an aromatic hydrocarbon, or a high molecular compound.

17. The light-emitting element according to claim 15, wherein the second substance having a hole-transport property is a substance having a hole mobility of $10^{-6}$ cm$^2$/Vs or more.

18. The light-emitting element according to claim 15, wherein the second acceptor substance is 7,7,8,8-tetracyano-2,3,5,6-tetrafluoroquinodimethane (abbreviation: F4-TCNQ), chloranil, a transition metal oxide, or an oxide of metals that belong to Group 4 to Group 8 of the periodic table.

19. The light-emitting element according to claim 15, wherein the second acceptor substance is added so that a weight ratio of the second acceptor substance to the substance having a hole-transport property is greater than or equal to 0.1:1 and less than or equal to 4.0:1 in the fifth layer.

20. The light-emitting element according to claim 15, wherein the fifth layer has a stack structure of a layer including the substance having a hole-transport property and a layer including the second acceptor substance.

21. A light-emitting device comprising the light-emitting element according to claim 1.

22. An electronic device comprising the light-emitting device according to claim 21.

23. A lighting device comprising the light-emitting device according to claim 21.

24. A light-emitting element comprising:
an EL layer between an anode and a cathode;
a first layer including a substance having a hole-transport property and an acceptor substance between the cathode and the EL layer;
a second layer including a first donor substance and a first substance having an electron-transport property and being in contact with the first layer and between the cathode and the EL layer; and
a third layer including a second donor substance and a second substance having an electron-transport property and being in contact with the second layer and with the EL layer and between the cathode and the EL layer,
wherein a LUMO level of the first substance having an electron-transport property is lower than a LUMO level of the second substance having an electron-transport property.

25. The light-emitting element according to claim 24, wherein the substance having a hole-transport property is an aromatic amine compound, a carbazole derivative, an aromatic hydrocarbon, or a high molecular compound.

26. The light-emitting element according to claim 24, wherein the substance having a hole-transport property is a substance having a hole mobility of $10^6$ cm$^2$/Vs or more.

27. The light-emitting element according to claim 24, wherein the substance having a hole-transport property has a higher hole-transport property than an electron-transport property.

28. The light-emitting element according to claim 24, wherein the acceptor substance is a transition metal oxide or an oxide of a metal belonging to Group 4 to Group 8 of the periodic table.

29. The light-emitting element according to claim 24, wherein the acceptor substance is molybdenum oxide.

30. The light-emitting element according to claim 24, wherein the first donor substance is an alkali metal, an alkaline earth metal, a rare earth metal, an alkali metal compound, an alkaline earth metal compound, or a rare earth metal compound.

31. The light-emitting element according to claim 24, wherein the second donor substance is an alkali metal, an alkaline earth metal, a rare earth metal, an alkali metal compound, an alkaline earth metal compound, or a rare earth metal compound.

32. The light-emitting element according to claim 24, wherein the EL layer comprises a fourth layer having an electron-transport property, and
wherein the fourth layer is in contact with the third layer.

33. The light-emitting element according to claim 24, wherein the acceptor substance is added so that a weight ratio of the acceptor substance to the substance having a hole-transport property is greater than or equal to 0.1:1 and less than or equal to 4.0:1 in the first layer.

34. The light-emitting element according to claim 24, wherein the first layer has a stack structure of a layer including the substance having a hole-transport property and a layer including the acceptor substance.

35. The light-emitting element according to claim 24, wherein the first donor substance is added so that a weight ratio of the first donor substance to the first substance having an electron-transport property is greater than or equal to 0.001:1 and less than or equal to 0.1:1 in the second layer.

36. The light-emitting element according to claim 24, wherein the LUMO level of the first substance having an electron-transport property included in the second layer is greater than or equal to −5.0 eV.

37. The light-emitting element according to claim 24, wherein the second donor substance is added so that a weight ratio of the second donor substance to the second substance having an electron-transport property is greater than or equal to 0.001:1 and less than or equal to 0.1:1 in the third layer.

38. The light-emitting element according to claim 24, wherein the EL layer comprises a fifth layer including a third substance having a hole-transport property and a second acceptor substance, and
wherein the fifth layer is in contact with the anode.

39. The light-emitting element according to claim 38, wherein the second substance having a hole-transport property is an aromatic amine compound, a carbazole derivative, an aromatic hydrocarbon, or a high molecular compound.

40. The light-emitting element according to claim 38, wherein the second substance having a hole-transport property is a substance having a hole mobility of $10^{-6}$ cm$^2$/Vs or more.

41. The light-emitting element according to claim 38, wherein the second acceptor substance is 7,7,8,8-tetracyano-2,3,5,6-tetrafluoroquinodimethane (abbreviation: F4-TCNQ), chloranil, a transition metal oxide, or an oxide of metals that belong to Group 4 to Group 8 of the periodic table.

42. The light-emitting element according to claim 38, wherein the second acceptor substance is added so that a weight ratio of the second acceptor substance to the substance having a hole-transport property is greater than or equal to 0.1:1 and less than or equal to 4.0:1 in the fifth layer.

43. The light-emitting element according to claim 38, wherein the fifth layer has a stack structure of a layer including the substance having a hole-transport property and a layer including the second acceptor substance.

44. A light-emitting device comprising the light-emitting element according to claim 24.

45. An electronic device comprising the light-emitting device according to claim 44.

46. A lighting device comprising the light-emitting device according to claim 44.

47. A light-emitting element comprising:
an EL layer between an anode and a cathode;
a first layer including a substance having a hole-transport property and an acceptor substance between the cathode and the EL layer;
a second layer including a first donor substance and a first substance having an electron-transport property and being in contact with the first layer and between the cathode and the EL layer; and
a third layer including a second donor substance and a second substance having an electron-transport property and being in contact with the second layer and with the EL layer and between the cathode and the EL layer, wherein the first substance is a perylene derivative or a nitrogen-containing condensed aromatic compound.

48. The light-emitting element according to claim 47, wherein the substance having a hole-transport property is an aromatic amine compound, a carbazole derivative, an aromatic hydrocarbon, or a high molecular compound.

49. The light-emitting element according to claim 47, wherein the substance having a hole-transport property is a substance having a hole mobility of $10^{-6}$ cm$^2$/Vs or more.

50. The light-emitting element according to claim 47, wherein the substance having a hole-transport property has a higher hole-transport property than an electron-transport property.

51. The light-emitting element according to claim 47, wherein the acceptor substance is a transition metal oxide or an oxide of a metal belonging to Group 4 to Group 8 of the periodic table.

52. The light-emitting element according to claim 47, wherein the acceptor substance is molybdenum oxide.

53. The light-emitting element according to claim 47, wherein the first donor substance is an alkali metal, an alkaline earth metal, a rare earth metal, an alkali metal compound, an alkaline earth metal compound, or a rare earth metal compound.

54. The light-emitting element according to claim 47, wherein the second donor substance is an alkali metal, an alkaline earth metal, a rare earth metal, an alkali metal compound, an alkaline earth metal compound, or a rare earth metal compound.

55. The light-emitting element according to claim 47, wherein the EL layer comprises a fourth layer having an electron-transport property, and wherein the fourth layer is in contact with the third layer.

56. The light-emitting element according to claim 47, wherein the acceptor substance is added so that a weight ratio of the acceptor substance to the substance having a hole-transport property is greater than or equal to 0.1:1 and less than or equal to 4.0:1 in the first layer.

57. The light-emitting element according to claim 47, wherein the first layer has a stack structure of a layer including the substance having a hole-transport property and a layer including the acceptor substance.

58. The light-emitting element according to claim 47, wherein the first donor substance is added so that a weight ratio of the first donor substance to the first substance having an electron-transport property is greater than or equal to 0.001:1 and less than or equal to 0.1:1 in the second layer.

59. The light-emitting element according to claim 47, wherein a LUMO level of the first substance having an electron-transport property included in the second layer is greater than or equal to −5.0 eV.

60. The light-emitting element according to claim 47, wherein the second donor substance is added so that a weight ratio of the second donor substance to the second substance having an electron-transport property is greater than or equal to 0.001:1 and less than or equal to 0.1:1 in the third layer.

61. The light-emitting element according to claim 47, wherein the EL layer comprises a fifth layer including a third substance having a hole-transport property and a second acceptor substance, and wherein the fifth layer is in contact with the anode.

62. The light-emitting element according to claim 61, wherein the second substance having a hole-transport property is an aromatic amine compound, a carbazole derivative, an aromatic hydrocarbon, or a high molecular compound.

63. The light-emitting element according to claim 61, wherein the second substance having a hole-transport property is a substance having a hole mobility of $10^{-6}$ cm$^2$/Vs or more.

64. The light-emitting element according to claim 61, wherein the second acceptor substance is 7,7,8,8-tetracyano-2,3,5,6-tetrafluoroquinodiethane (abbreviation: F4-TCNQ), chioranil, a transition metal oxide, or an oxide of metals that belong to Group 4 to Group 8 of the periodic table.

65. The light-emitting element according to claim 61, wherein the second acceptor substance is added so that a weight ratio of the second acceptor substance to the substance having a hole-transport property is greater than or equal to 0.1:1 and less than or equal to 4.0:1 in the fifth *layer*.

66. The light-emitting element according to claim 61, wherein the fifth layer has a stack structure of a layer including the substance having a hole-transport property and a layer including the second acceptor substance.

67. A light-emitting device comprising the light-emitting element according to claim 47.

68. An electronic device comprising the light-emitting device according to claim 67.

69. A lighting device comprising the light-emitting device according to claim 67.

* * * * *

UNITED STATES PATENT AND TRADEMARK OFFICE
CERTIFICATE OF CORRECTION

PATENT NO. : 8,389,979 B2  
APPLICATION NO. : 12/785644  
DATED : March 5, 2013  
INVENTOR(S) : Hiromi Nowatari et al.

Page 1 of 1

It is certified that error appears in the above-identified patent and that said Letters Patent is hereby corrected as shown below:

In the Specifications:

At column 3, line 13, "bather" should be --barrier--;

At column 8, line 5, "methacrylamie" should be --methacrylamide--;

In the Claims:

At column 36, line 29, "tetrafluoroquinodiethane" should be --tetrafluoroquinodimethane--;

At column 36, line 30, "chioranil" should be --chloranil--.

Signed and Sealed this
Fourteenth Day of May, 2013

Teresa Stanek Rea
*Acting Director of the United States Patent and Trademark Office*